(12) United States Patent
Moon et al.

(10) Patent No.: US 9,041,018 B1
(45) Date of Patent: May 26, 2015

(54) ORGANIC PHOTOVOLTAIC CELL AND LIGHT EMITTING DIODE WITH AN ARRAY OF 3-DIMENSIONALLY FABRICATED ELECTRODES

(71) Applicants: Kee Suk Moon, San Diego, CA (US); Samuel Kassegne, San Diego, CA (US); Khaled Morsi, San Diego, CA (US)

(72) Inventors: Kee Suk Moon, San Diego, CA (US); Samuel Kassegne, San Diego, CA (US); Khaled Morsi, San Diego, CA (US)

(73) Assignee: San Diego State University Research Foundation, San Diego, CA (US)

( * ) Notice: Subject to any disclaimer, the term of this patent is extended or adjusted under 35 U.S.C. 154(b) by 149 days.

(21) Appl. No.: 13/627,077

(22) Filed: Sep. 26, 2012

Related U.S. Application Data

(62) Division of application No. 12/997,241, filed as application No. PCT/US2009/046803 on Jun. 9, 2009, now Pat. No. 8,629,462.

(60) Provisional application No. 61/059,995, filed on Jun. 9, 2008.

(51) Int. Cl.
 *H01L 33/00* (2010.01)
 *H01L 51/44* (2006.01)
(52) U.S. Cl.
 CPC .................................. *H01L 51/441* (2013.01)

(58) Field of Classification Search
 USPC ........................................ 257/88–91, E51.018
 See application file for complete search history.

(56) References Cited

U.S. PATENT DOCUMENTS

| | | | |
|---|---|---|---|
| 5,053,083 A | 10/1991 | Sinton | |
| 5,082,791 A | 1/1992 | Micheels et al. | |
| 5,296,125 A * | 3/1994 | Glass et al. | 430/311 |
| 2004/0229394 A1 | 11/2004 | Yamada et al. | |
| 2006/0076557 A1 | 4/2006 | Waller et al. | |
| 2006/0112983 A1 | 6/2006 | Parce et al. | |
| 2007/0025139 A1 | 2/2007 | Parsons | |
| 2007/0062577 A1 | 3/2007 | Koppe | |
| 2007/0119496 A1 | 5/2007 | Baldo et al. | |
| 2007/0151601 A1 | 7/2007 | Jung et al. | |
| 2007/0204902 A1 | 9/2007 | Dutta | |
| 2007/0285843 A1 | 12/2007 | Tran | |
| 2008/0017244 A9 | 1/2008 | Sun | |

\* cited by examiner

*Primary Examiner* — Tran Tran
(74) *Attorney, Agent, or Firm* — Todd L. Juneau

(57) ABSTRACT

Disclosed herein, in certain instances, is a novel photovoltaic cell that uses unique micro-architectural and multi-layer functional designs. Further disclosed herein, in certain instances, is a 3-dimensional electrode. Disclosed herein, in certain instances, is a novel electroluminescent cell that uses unique micro-architectural and multi-layer functional designs. Further disclosed herein, in certain instances, is a 3-dimensional diode.

18 Claims, 28 Drawing Sheets

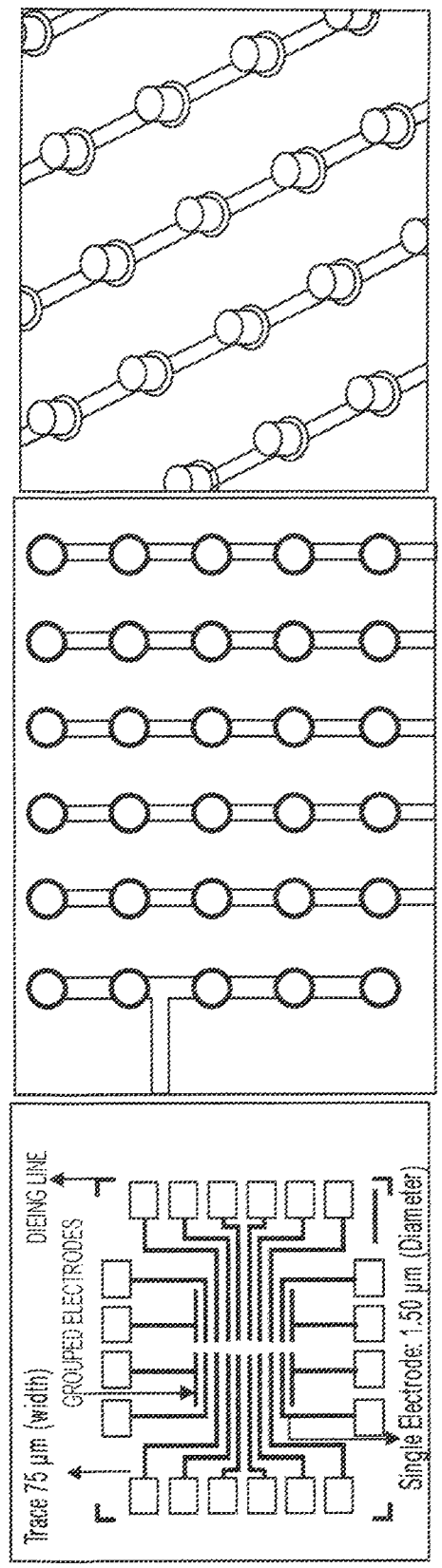

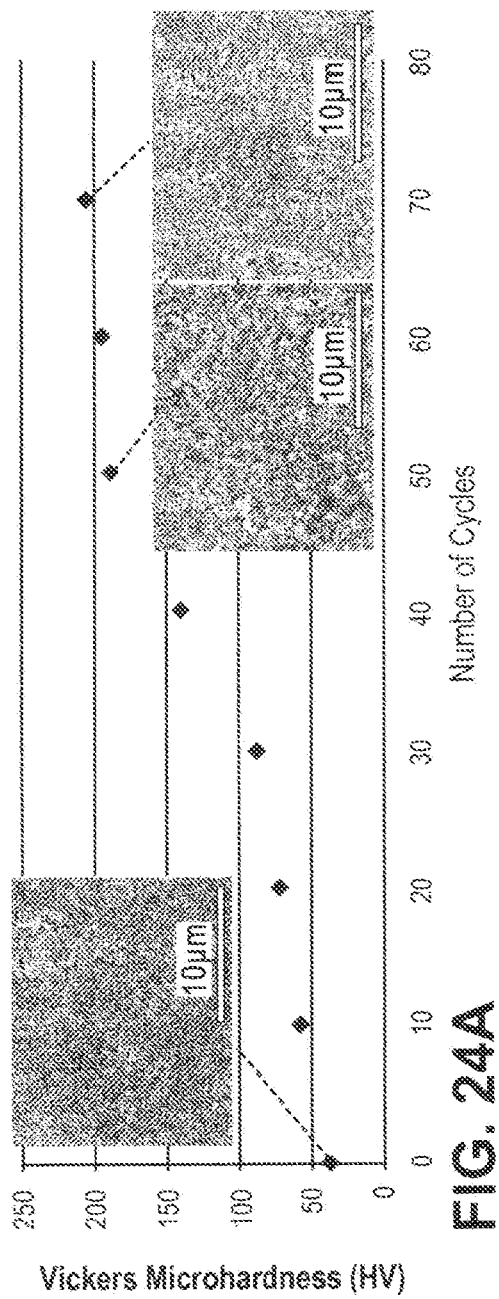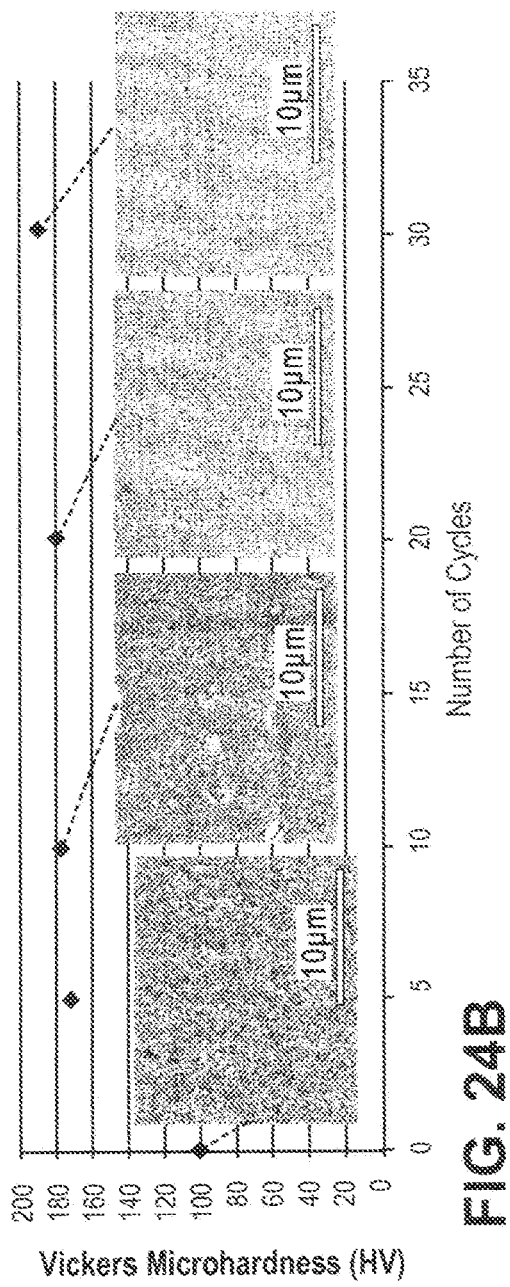
FIG. 24A
FIG. 24B

ORGANIC PHOTOVOLTAIC CELL AND LIGHT EMITTING DIODE WITH AN ARRAY OF 3-DIMENSIONALLY FABRICATED ELECTRODES

CROSS-REFERENCE

This application claims the benefit under 35 USC 121 of prior U.S. nonprovisional application No. 12/997,241, filed Mar. 15, 2011, which claims the benefit under 35 USC 371 of prior International application No. PCT/US2009/046803, filed Jun. 9, 2010, which claims the benefit under 35 USC 119(e) of U.S. Provisional Application No. 61/059,995, filed Jun. 9, 2008, the contents of the applications are incorporated herein by reference in their entirety.

STATEMENT AS TO FEDERALLY SPONSORED RESEARCH

This invention was made with the support of the United States government under number 0826532 by the National Science Foundation.

BACKGROUND OF THE INVENTION

Solar energy is abundantly available in the environment and photovoltaic cells are the main devices to convert solar energy into electricity. In the US, about 6% of total energy is provided by renewable sources, of which only 6% is attributable to solar cells.

SUMMARY OF THE INVENTION

Disclosed herein, in certain instances, is a novel photovoltaic cell that uses micro-architectural and multi-layer functional designs. Currently, off-the-shelf silicon-based solar cell modules deliver energy efficiencies in the range of 15% with costs 30 cents to 40 cents per kWh (~10 cents/kWh for grid-connected US electricity). The cells provided herein will offer an economic scale well below a target cost of about $4000/kWp, namely, under 20 cents/kWh if mass-produced, which is about 50% of the cost of the state-of-the-art silicon-based photovoltaic cells in current market.

Further disclosed herein, in certain instances, is a 3-dimensional electrode. As compared to traditional planar electrodes, the three-dimensional electrode design disclosed herein increases the surface contact areas (for example, by 3 to 6 times) for thick photoactive layers without increasing the electrical resistance, and thus improving the energy conversion efficiency.

Disclosed herein, in certain instances, is a novel electroluminescent cell that uses unique micro-architectural and multi-layer functional designs.

Further disclosed herein, in certain instances, is a 3-dimensional diode. As compared to traditional planar diodes, the three-dimensional electrode design disclosed herein increases surface area.

Disclosed herein, in certain embodiments, is a photovoltaic cell comprising: (a) a plurality of three-dimensional electrodes comprising a conductive or semi-conductive or semi-conductive material, wherein the conductive or semi-conductive or semi-conductive material is selected from: carbon, a carbon allotrope, or an organic polymer; and (b) at least one photoactive material; wherein the shape of the electrodes varies along the vertical axis. In some embodiments, the photovoltaic cell provides energy conversion efficiency of at least 5%, 7%, 10%, 15%, 20%, 25%, 30%, 40%, or 50%. In some embodiments, at least some of the three-dimensional electrodes are coated with a conductive polymer. In some embodiments, the electrodes comprise anodes and cathodes and the anodes are selectively coated with the conductive polymer. In some embodiments, at least some of the anodes are coated with PEDOT:PSS. In some embodiments, the cell further comprises two clear layers whereby the electrodes and the photoactive material and sandwiched between the two clear layers. In some embodiments, electromagnetic radiation passes through at least two of the clear layers and at least a portion of said electromagnetic radiation is converted to energy. In some embodiments, the electromagnetic radiation is visible light. In some embodiments, a photon from the electromagnetic radiation is absorbed by the photoactive material. In some embodiments, the photoactive material comprises a donor polymer and absorption of the photon excites an electron in the donor polymer. In some embodiments, an excited electron migrates to the cathode creating a potential difference. In some embodiments, the diffusion length for migrating charges is less than 100 nm. In some embodiments, the three-dimensional electrodes form an array comprising anodes and cathodes. In some embodiments, at least some of the anodes have a work function of 5 eV or higher. In some embodiments, at least some of the cathodes have a work function of 5 eV or less. In some embodiments, at least some of the three-dimensional electrodes are in the shape of a cylinder, a pyramid, a diamond, sphere, hemisphere, or a rectangular prism. In some embodiments, the three-dimensional electrodes are in the shape of pyramids. In some embodiments, the three-dimensional electrodes are in the shape of cylinders. In some embodiments, the electrodes are manufactured using a conductive or semi-conductive or semi-conductive material that is subjected to a patterning process. In some embodiments, the electrodes are manufactured using a conductive or semi-conductive or semi-conductive material that is subjected to a patterning process selected from: stamping, extrusion, printing, lithography, rolling, or combinations thereof. In some embodiments, the electrodes are manufactured using a conductive or semi-conductive or semi-conductive material that is subjected to a patterning process followed by heating. In some embodiments, the electrodes are manufactured using a conductive or semi-conductive or semi-conductive material that is subjected to a patterning process followed by sintering, pyrolysis, or baking. In some embodiments, the electrodes are manufactured using a conductive or semi-conductive or semi-conductive material that is subjected to a patterning process followed by pyrolysis. In some embodiments, the electrodes are manufactured using a conductive or semi-conductive or semi-conductive material that is subjected to a patterning process followed by sintering. In some embodiments, the electrodes comprise graphite or glassy carbon. In some embodiments, the electrodes are arranged in a grouped pattern. In some embodiments, the electrodes are arranged in a separated pattern. In some embodiments, the electrodes are formed in a no trace architecture. In some embodiments, at least some of the electrodes form a trace architecture. In some embodiments, at least some of the electrodes are transparent. In some embodiments, at least some of the electrodes are porous. In some embodiments, the photoactive material surrounds at least some of the electrodes. In some embodiments, the photoactive material comprises a matrix of heterojunction photoactive material. In some embodiments, the photoactive material comprises crystalline silicone, cadmium telluride copper-indium selenide, copper indium/gallium diselenide, ruthenium metalorganic dye, P3HT (poly(3-hexylthiophene)), PCBM (phenyl-C61-butyric acid methyl ester), or combinations thereof. In some embodiments, the photoactive material comprises P3HT (poly(3-hexylthiophene)) and PCBM (phenyl-C61-butyric acid methyl ester). In some embodiments, the photoactive material comprises P3HT (poly(3-hexylthiophene)) and PCBM (phenyl-C61-butyric acid methyl ester) in a 1:1 ratio by weight. In some embodiments, the cell comprises a first and a second photoactive material; and wherein the absorption spectrum of the first photoactive material and the absorption of the second photoactive material are different. In some embodiments, the first and second photoactive materials are in defined layers. In some embodiments, the surface area of the photoactive material is increased, for example, by a factor of about 3 to about 6. In some embodiments, the cell further comprises a transparent material, wherein the transparent material protects the cell from oxidation. In some embodiments, the cell further comprises a transparent material of glass, plastic, ceramic or a combination thereof. In some embodiments, the cell further comprises a transparent material of glass, wherein the glass protects the cell from oxidation. In some embodiments, the cell further comprises a transparent material of plastic, wherein the glass protects the cell from oxidation. In some embodiments, the cell is a solar cell. In some embodiments, the cell is used to make a solar panel.

Disclosed herein, in some embodiments, is a solar panel comprising a plurality of photovoltaic cells disclosed herein.

Disclosed herein, in certain embodiments, is a three dimensional electrode comprising a conductive or semi-conductive or semi-conductive material, wherein the conductive or semi-conductive material is selected from: carbon, a carbon allotrope, or an organic polymer, and wherein the shape of the electrode varies along the vertical axis. In some embodiments, the three-dimensional electrode is coated with a conductive polymer. In some embodiments, the electrode is a cathode. In some embodiments, the electrode is an anode and the anode is coated with the conductive polymer. In some embodiments, the anode is coated with PEDOT:PSS. In some embodiments, an anode has a work function of 5 eV or higher. In some embodiments, a cathode has a work function of 5 eV or less. In some embodiments, the electrodes comprise a carbon material. In some embodiments, the electrodes comprise graphite or glassy carbon. In some embodiments, the electrode is in the shape of cylinder, a pyramid, a diamond, sphere, hemisphere, or a rectangular prism. In some embodiments, the electrode is in the shape of a pyramid. In some embodiments, the electrode is in the shape of a cylinder. In some embodiments, the electrode is manufactured using a conductive powder that is subjected to a patterning process. In some embodiments, the electrode is manufactured using a conductive or semi-conductive material that is subjected to a patterning process selected from: stamping, extrusion, printing, lithography, rolling, or combinations thereof. In some embodiments, the electrode is manufactured using a conductive or semi-conductive material that is subjected to a patterning process followed by heating. In some embodiments, the electrode is manufactured using a conductive or semi-conductive material that is subjected to a patterning process followed by sintering, pyrolysis, or baking. In some embodiments, the electrode is manufactured using a conductive polymer that is subjected to a patterning process followed by pyrolysis. In some embodiments, the electrode is manufactured using a conductive powder that is subjected to a patterning process followed by sintering. In some embodiments, at least some of the electrodes are porous.

Disclosed herein, in certain embodiments, is an electroluminescent cell comprising: a plurality of three-dimensional diodes comprising a conductive or semi-conductive material, wherein the conductive or semi-conductive material is selected from: carbon, a carbon allotrope, or an organic polymer; and a current source; wherein the shape of the diodes varies along the vertical axis, and wherein the electroluminescent cell provides energy conversion efficiency of at least 10%. In some embodiments, the photovoltaic cell provides energy conversion efficiency of at least 5%, 10%, 15%, 20%, 25%, 30%, 40%, or 50%. In some embodiments, the diode comprises an anode and a cathode. In some embodiments, the diode comprises a donor polymer and an acceptor polymer. In some embodiments, at least a portion of the diodes is coated with a conductive polymer. In some embodiments, the anodes are selectively coated with the conductive polymer. In some embodiments, the anodes are coated with PEDOT:PSS. In some embodiments, the current excites electrons in the donor material. In some embodiments, the electrons in the donor material combine with a hole. In some embodiments, the combining of an electron and a hole results in the electron falling into a lower energy level. In some embodiments, an electron falling into a lower energy level releases a photon. In some embodiments, the three-dimensional diodes form an array. In some embodiments, at least some of the three-dimensional diodes are in the shape of a cylinder, a pyramid, a diamond, sphere, hemisphere, or a rectangular prism. In some embodiments, the three-dimensional diodes are in the shape of pyramids. In some embodiments, the three-dimensional diodes are in the shape of cylinders. In some embodiments, the diodes are manufactured using a conductive or semi-conductive material that is subjected to a patterning process. In some embodiments, the diodes are manufactured using a conductive or semi-conductive material that is subjected to a patterning process selected from: stamping, extrusion, printing, lithography, rolling, or combinations thereof. In some embodiments, the electrodes are manufactured using a conductive or semi-conductive material that is subjected to a patterning process followed by heating. In some embodiments, the diodes are manufactured using a conductive or semi-conductive material that is subjected to a patterning process followed by sintering, pyrolysis, or baking. In some embodiments, the diodes are manufactured using a conductive or semi-conductive material that is subjected to a patterning process followed by pyrolysis. In some embodiments, the diodes are manufactured using a conductive or semi-conductive material that is subjected to a patterning process followed by sintering. In some embodiments, the electrodes comprise graphite or glassy carbon. In some embodiments, the diodes are arranged in a grouped pattern. In some embodiments, the diodes are arranged in a separated pattern. In some embodiments, the diodes are formed in a no trace architecture. In some embodiments, the diodes form a trace architecture. In some embodiments, at least some of the diodes are transparent. In some embodiments, at least some of the diodes have a porous surface. In some embodiments, at least some of the diodes have a non-porous surface. In some embodiments, the cell further comprises a transparent material, wherein the transparent material protects the cell from oxidation. In some embodiments, the cell further comprises a transparent material of glass, plastic, ceramic or a combination thereof. In some embodiments, the cell further comprises a transparent material of glass, wherein the glass protects the cell from oxidation. In some embodiments, the cell further comprises a transparent material of plastic, wherein the glass protects the cell from oxidation.

Disclosed herein, in some embodiments, is a three dimensional diode comprising a conductive or semi-conductive material, wherein the conductive or semi-conductive material is selected from: carbon, a carbon allotrope, or an organic polymer, and wherein the shape of the diode varies along the vertical axis. In some embodiments, at least a portion of the three-dimensional diode is coated with a conductive polymer. In some embodiments, the diode comprises an anode and a cathode. In some embodiments, the anode is coated with the conductive polymer. In some embodiments, the anode is coated with PEDOT:PSS. In some embodiments, the conductive or semi-conductive material is graphite or glassy carbon. In some embodiments, the diode is in the shape of a cylinder, a pyramid, a diamond, sphere, hemisphere, or a rectangular prism. In some embodiments, the diode is in the shape of a pyramid. In some embodiments, the diode is in the shape of a cylinder. In some embodiments, the diode is manufactured using a conductive powder that is subjected to a patterning process. In some embodiments, the diode is manufactured using a conductive or semi-conductive material that is subjected to a patterning process selected from: stamping, extrusion, printing, lithography, rolling, or combinations thereof. In some embodiments, the diode is manufactured using a conductive or semi-conductive material that is subjected to a patterning process followed by heating. In some embodiments, the diode is manufactured using a conductive or semi-conductive material that is subjected to a patterning process followed by sintering, pyrolysis, or baking. In some embodiments, the diode is manufactured using a conductive polymer that is subjected to a patterning process followed by pyrolysis. In some embodiments, the diode is manufactured using a conductive powder that is subjected to a patterning process followed by sintering. In some embodiments, at least some of the diodes have a porous surface. In some embodiments, at least some of the diodes have a non-porous surface.

Disclosed herein, in certain embodiments, is a photovoltaic cell comprising: a plurality of three-dimensional electrodes comprising a conductive or semi-conductive material, wherein the conductive or semi-conductive material is selected from: a metal, a metal alloy, an intermetallic material, a metallic glass, a composite material, a polymer, biocompatible material, or combinations thereof; and at least one photoactive material; wherein the shape of the electrodes varies along the vertical axis.

Disclosed herein, in certain embodiments, is a A three dimensional electrode comprising a conductive or semi-conductive material, wherein the conductive or semi-conductive material is selected from: a metal, a metal alloy, an intermetallic material, a metallic glass, a composite material, a polymer, biocompatible material, or combinations thereof; and wherein the shape of the electrode varies along the vertical axis.

Disclosed herein, in certain embodiments, is an electroluminescent cell comprising: a plurality of three-dimensional diodes comprising a conductive or semi-conductive material, wherein the conductive or semi-conductive material is selected from: a metal, a metal alloy, an intermetallic material, a metallic glass, a composite material, a polymer, biocompatible material, or combinations thereof; and a current source; wherein the shape of the diodes varies along the vertical axis.

Disclosed herein, in certain embodiments, is a three dimensional diode comprising a conductive or semi-conductive material, wherein the conductive or semi-conductive material is selected from: a metal, a metal alloy, an intermetallic material, a metallic glass, a composite material, a polymer, biocompatible material, or combinations thereof, and wherein the shape of the diode varies along the vertical axis.

BRIEF DESCRIPTION OF THE DRAWINGS

The novel features of the invention are set forth with particularity in the appended claims. A better understanding of the features and advantages of the present invention will be obtained by reference to the following detailed descriptions that sets forth illustrative embodiments, in which the principles of the invention are utilized, and the accompanying drawings of which:

FIG. 11A shows the geometry of the chip that forms the basis of a 3-D graphite micro-electrode based photovoltaic cell. The electrodes have 150 μm diameter with 350 μm spacing and traces of 75 μm width and bump pad of 1 mm×1 mm size. FIG. 11B is an SEM image after patterning. FIG. 11C is an SEM image of 3-D electrodes.

FIG. 13A shows that heat treatment is found to offer a smoother topology. FIG. 13B shows that air-dried photoactive materials tend to crystallize.

FIG. 24A shows the effect of number of cycles on the microhardness of locally sintered (material surface immediately beneath the tip) nickel under configuration A. It is clear that the hardness increases from ~38 HV for the green compact to over 200 HV after 70 current cycles, for a highly sintered localized region. The increase in hardness becomes significant after 30 cycles. FIG. 24B shows the grain growth that was also observed as the sintering proceeds.

FIG. 27A shows the details of a chip with four wires each connected to four sets of five electrodes; two sets of five electrodes that serve as anodes were covered with PEDOT:PSS; and the chip had seven layers. FIG. 27B shows the details of a chip with five layers; the chip had a row of five electrodes that were connected to form cathodes and another row of five electrodes that were connected to form anodes; the cell comprised two wires connecting cathodes and anodes; and the electrodes were diamond shaped and heat treated.

DETAILED DESCRIPTION OF THE INVENTION

Figure 1:
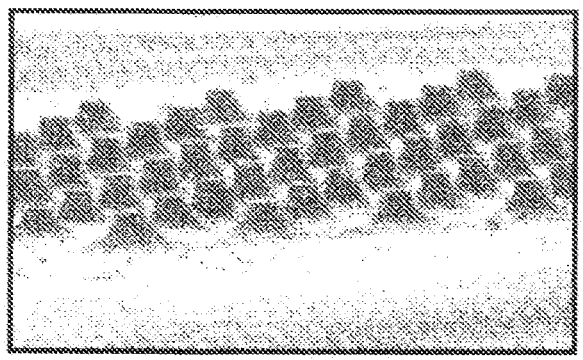
FIG. 1 shows an array of 3 dimensionally fabricated micro electrodes.
Figure 2:
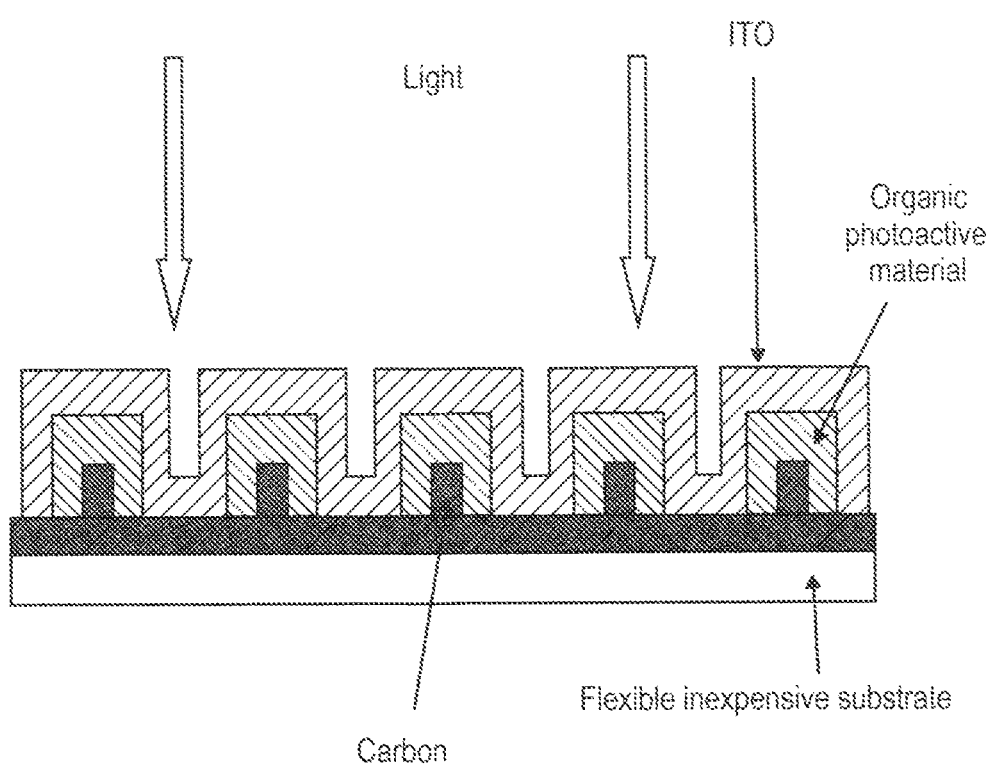
FIG. 2 shows the 3-D architecture of an organic PV cell with the 3D electrodes.
Figure 3:
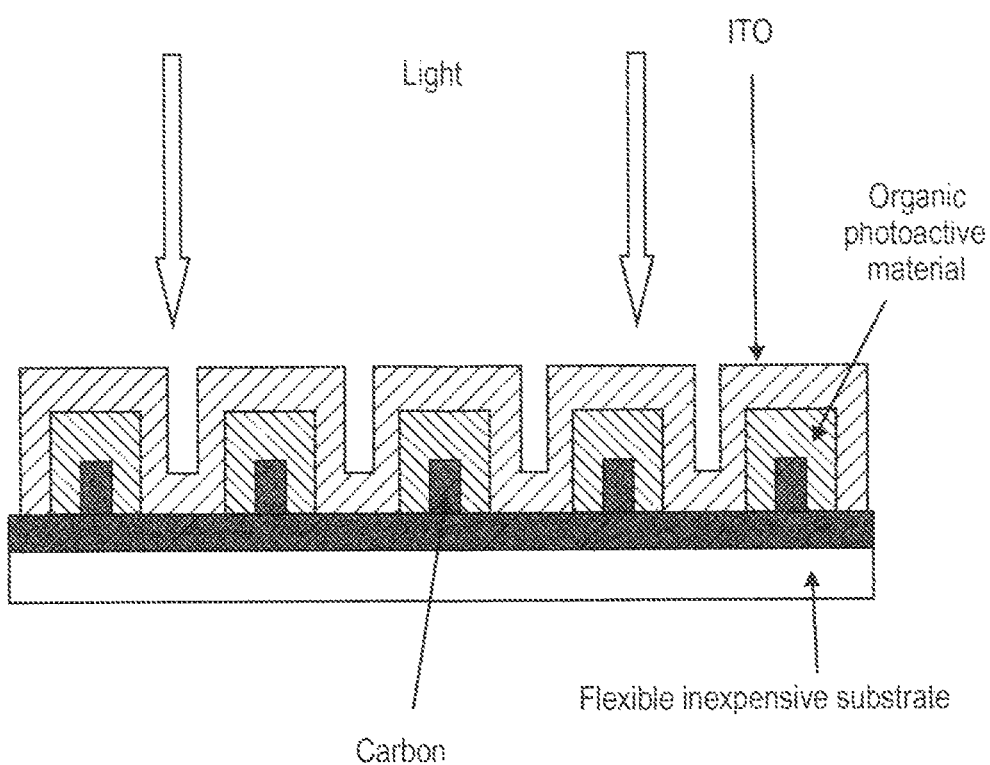
FIG. 3 shows the manufacturing steps for an electrode disclosed herein. The micro (or nano) stamping process is followed by a sintering process (here by a electric current).
Figure 4:
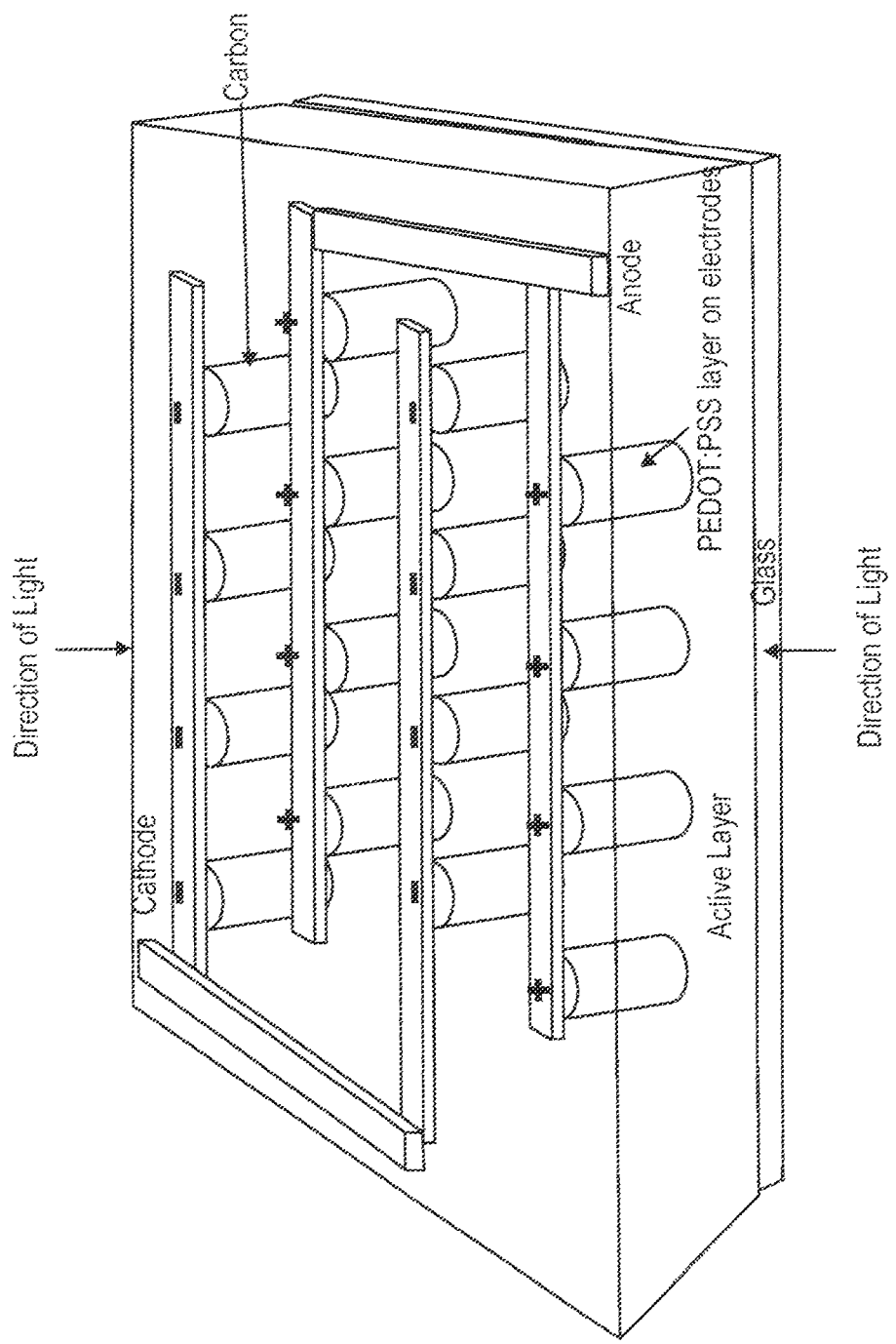
FIG. 4 is a schematic representation of an array of 3D carbon electrodes architecture with separated trace pattern.
Figure 5:
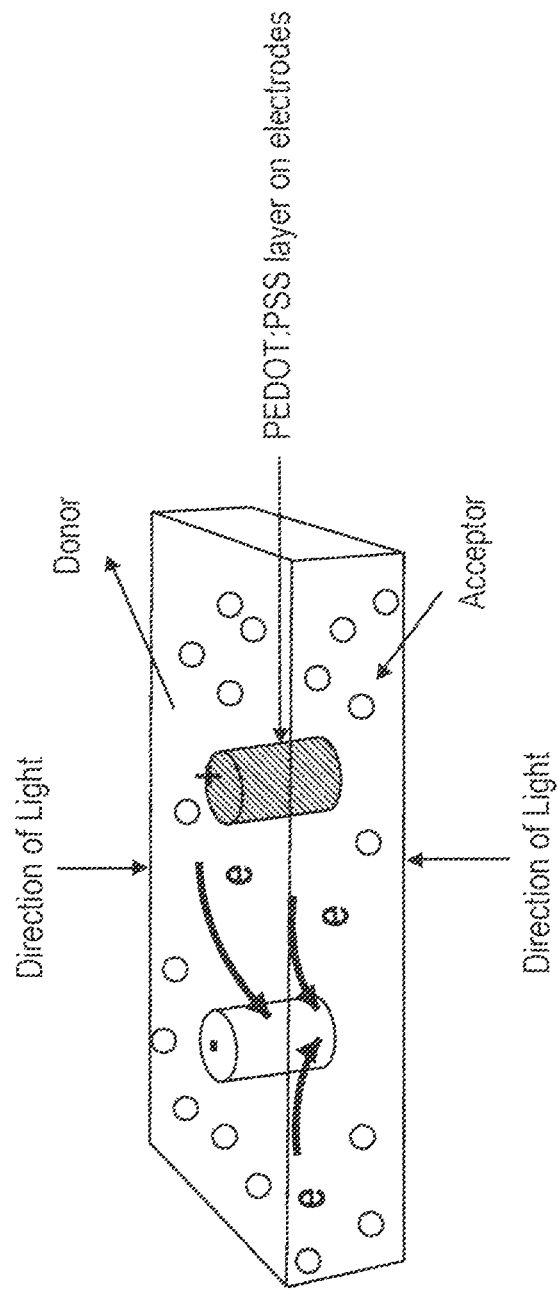
FIG. 5 is a schematic structure of the electron harvesting using the 3D electrodes and polymeric photovoltaic interaction.
Figure 6:
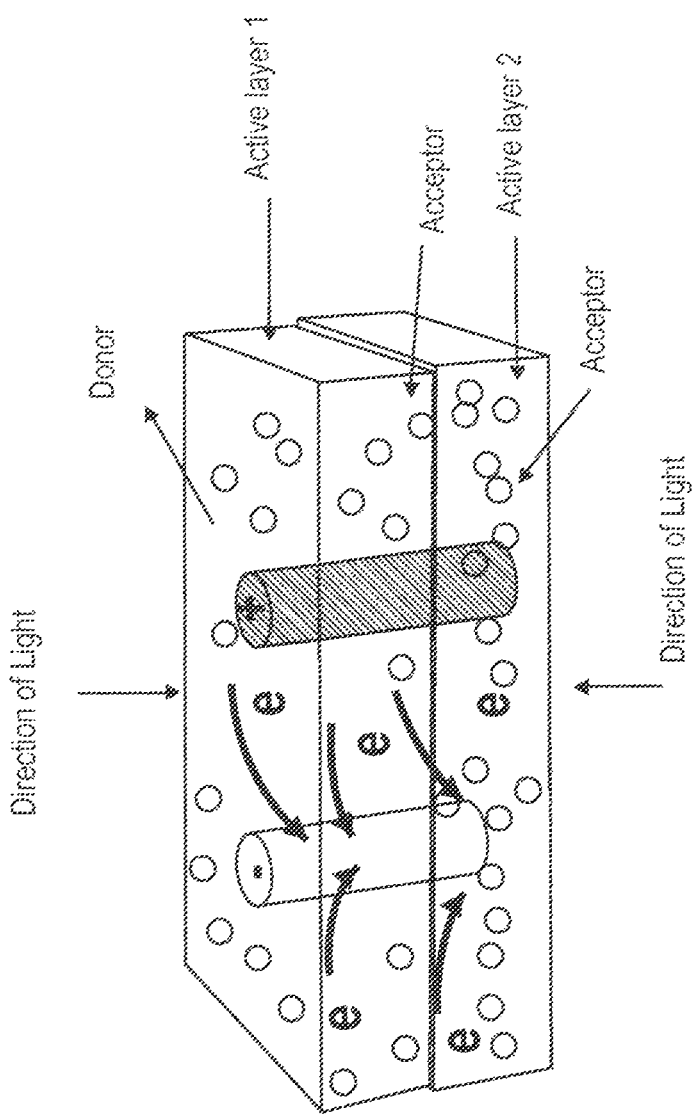
FIG. 6 shows the 3-D architecture with multiple photoactive layers of different types to absorb different peaks of spectrums within visible light.
Figure 7:
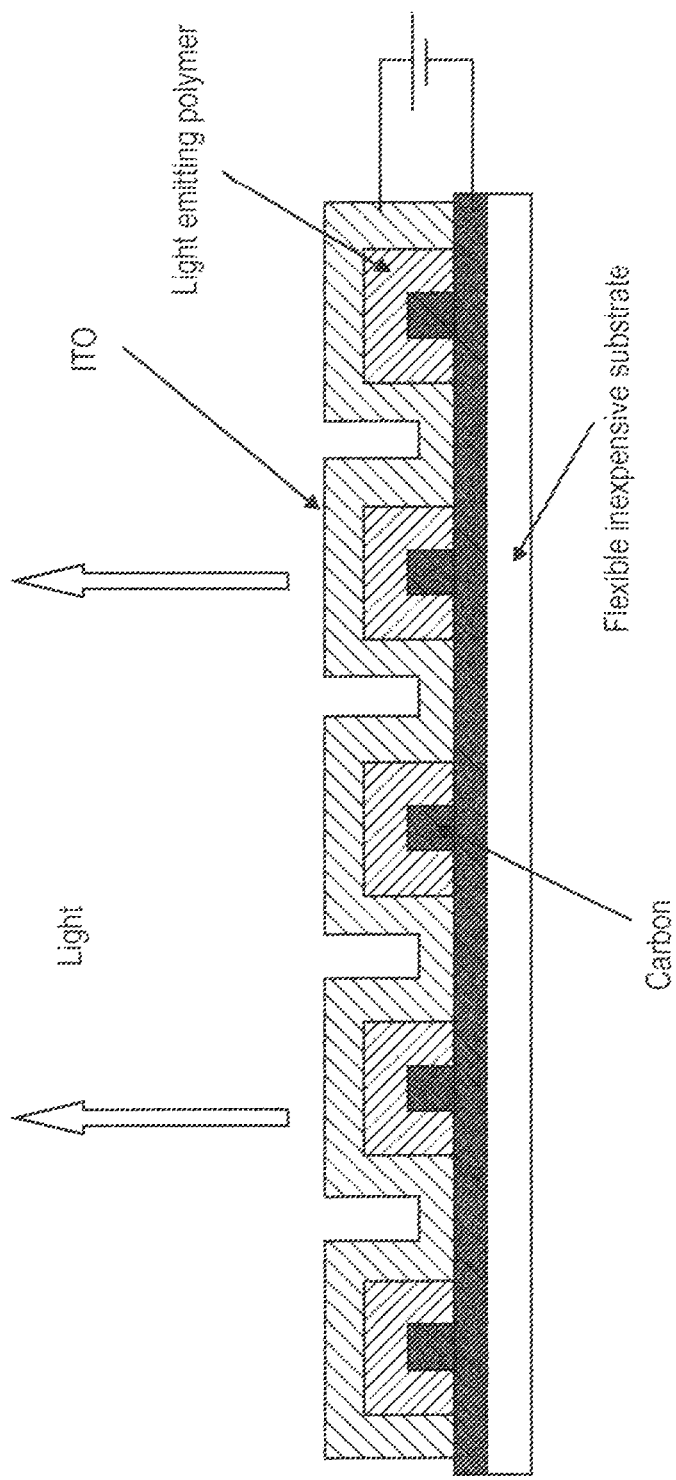
FIG. 7 shows the 3-D electrode architecture with increased OLED surface areas.
Figure 8:
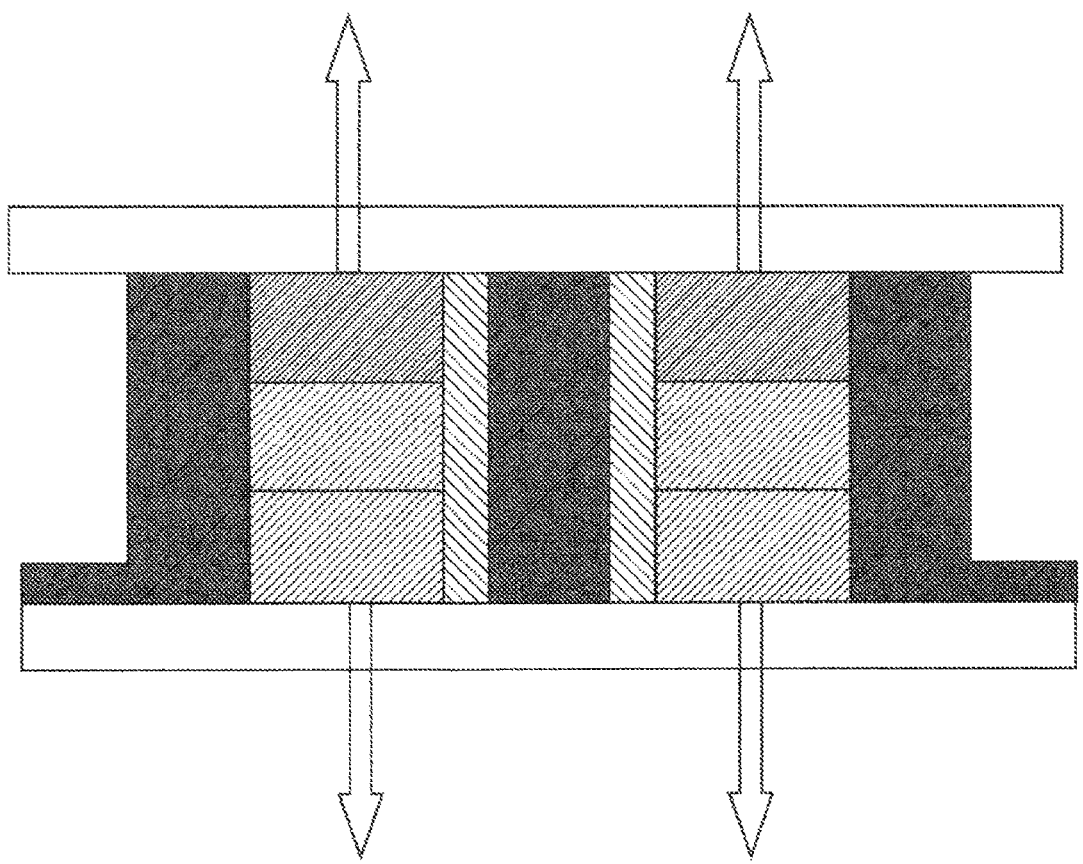
FIG. 8 shows the 3-D architecture with a novel white tandem OLEDs by vertically stacking in series multiple electroluminescent layers.
Figure 9:
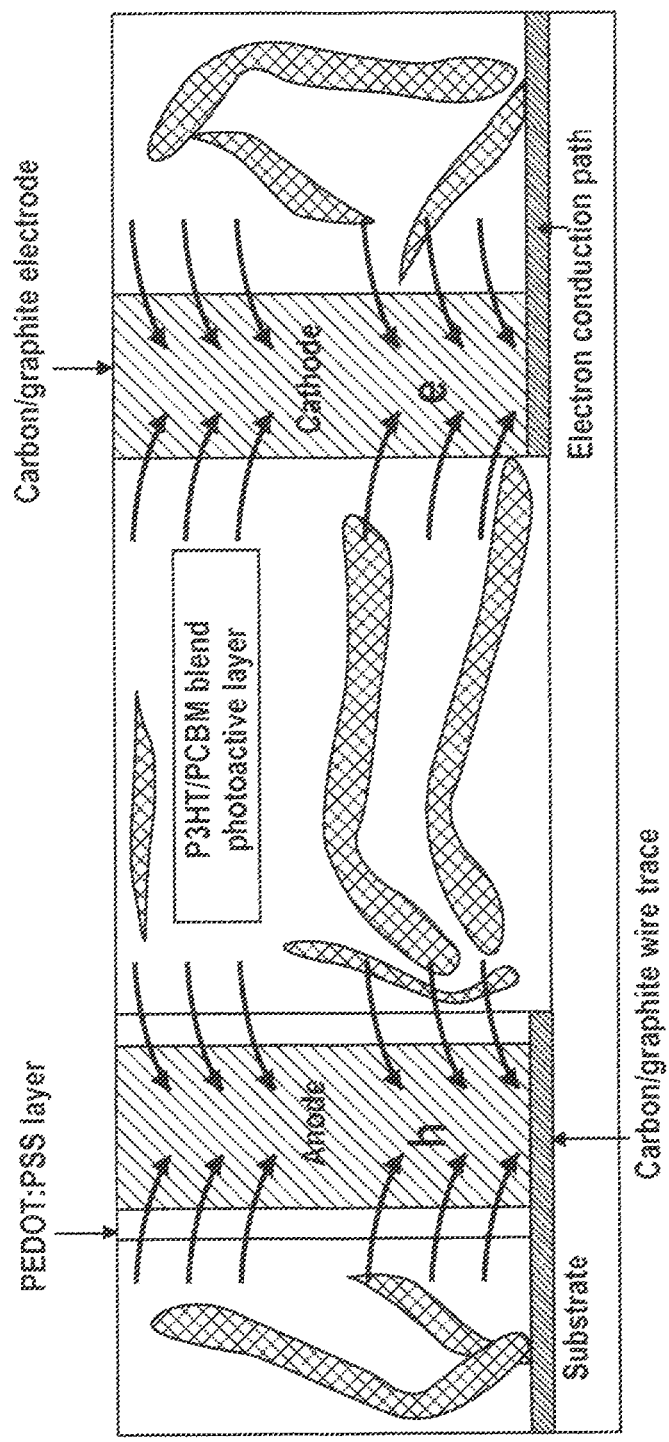
FIG. 9 shows a 2-D cross-sectional view of the architecture of 'all-polymer' Organic-MEMS/NEMS based organic photovoltaic cell, 'd' is the depth of the cell and varies from 5 m to 25 m. Electrons are collected through out the depth of the graphite cathode whereas holes travel to PEDOT:PSS layer that runs through the depth of the anodes. The circuit is completed through graphite wire traces which act as electron and hole conduction paths.
Figure 10:
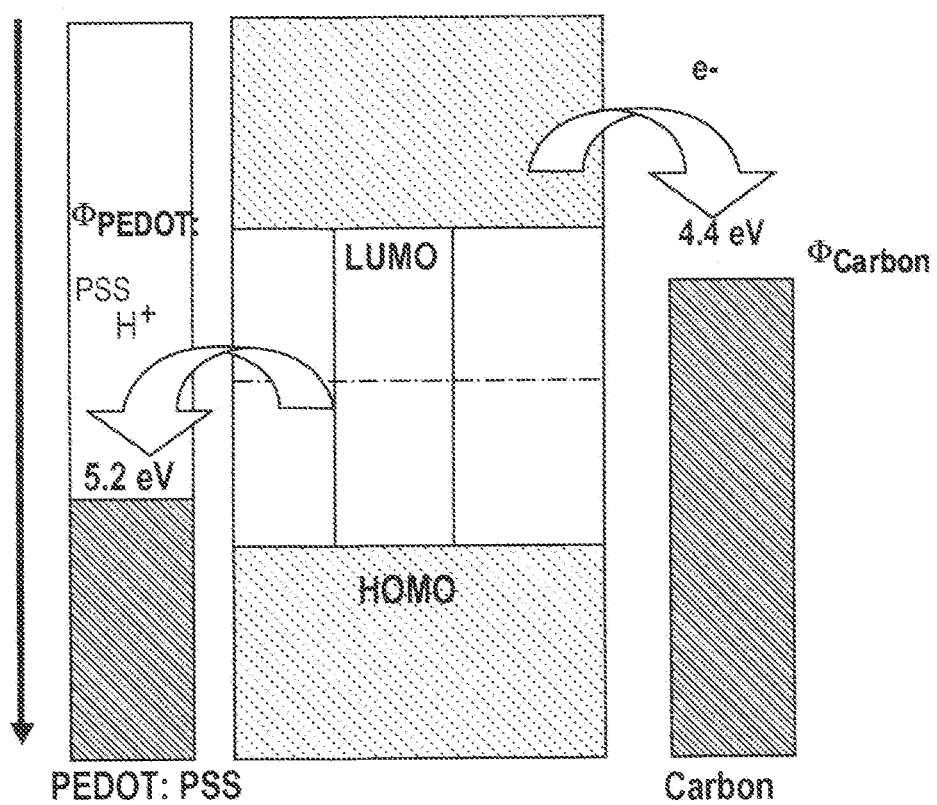
FIG. 10 shows the Fermi energy level diagrams and light harvesting relative to vacuum level for the AllPoly system in flat band conditions. During light energy exposure, an electron is promoted to the LUMO (lowest unoccupied molecular orbital) leaving a hole behind in the HOMO (highest occupied molecular orbital). Electrons are collected in the pyrolysed carbon (graphite) electrode and holes at the PEDOT:PSS electrode.

Disclosed herein, in certain instances, is a novel photovoltaic cell that uses unique micro-architectural and multi-layer functional designs. Currently, off-the-shelf silicon-based solar cell modules deliver energy efficiencies in the range of 15% with costs 30 cents to 40 cents per kWh (~10 cents/kWh for grid-connected US electricity). These novel cells will offer an economic scale well below a target cost of about $4000/kWp, namely, under 20 cents/kWh if mass-produced, which is about 50% of the cost of the state-of-the-art silicon-based photovoltaic cells in current market.

Further disclosed herein, in certain instances, is a 3-dimensional electrode. As compared to traditional planar electrodes, the three-dimensional electrode design disclosed herein increases the surface contact areas (by 3 to 6 times) for thick photoactive layers without increasing the electrical resistance, and thus improving the energy conversion efficiency.

Disclosed herein, in certain instances, is a novel electroluminescent cell that uses unique micro-architectural and multi-layer functional designs.

Further disclosed herein, in certain instances, is a 3-dimensional diode. As compared to traditional planar diodes, the three-dimensional electrode design disclosed herein increases surface area.

I. Electrodes

Disclosed herein, in certain embodiments, is a three dimensional electrode comprising a conductive or semi-conductive material, wherein the conductive or semi-conductive material is selected from: carbon, a carbon allotrope, or an organic polymer, and wherein the shape of the electrode varies along the vertical axis. In some embodiments, the electrode is an all-polymer electrode.

In some embodiments, the photovoltaic cell provides energy conversion efficiency of at least 5%, 10%, 15%, 20%, 25%, 30%, 40%, or 50%. In some embodiments, the photovoltaic cell provides energy conversion efficiency of at least 5%. In some embodiments, the photovoltaic cell provides energy conversion efficiency of at least 7%. In some embodiments, the photovoltaic cell provides energy conversion efficiency of at least 10%. In some embodiments, the photovoltaic cell provides energy conversion efficiency of at least 15%. In some embodiments, the photovoltaic cell provides energy conversion efficiency of at least 20%. In some embodiments, the photovoltaic cell provides energy conversion efficiency of at least 25%. In some embodiments, the photovoltaic cell provides energy conversion efficiency of at least 30%. In some embodiments, the photovoltaic cell provides energy conversion efficiency of at least 40%. In some embodiments, the photovoltaic cell provides energy conversion efficiency of at least 50%.

In some embodiments, the electrode is an anode or a cathode. In some embodiments, the anode has a work function of 5 eV or higher. In some embodiments, the cathode has a work function of less than 5 eV.

Shape

In some embodiments, the electrode is a three-dimensional electrode. In some embodiments, the three-dimensional electrodes are in the shape of a cylinder, a pyramid, a diamond, sphere, hemisphere, or a rectangular prism. In some embodiments, the three-dimensional electrodes are in the shape of pyramids. In some embodiments, the three-dimensional electrodes are in the shape of cylinders. In some embodiments, utilizing a three-dimensional electrode increases the electrode/polymer contact surface area and hence interaction. In some embodiments, the narrow gap between the three-dimensional electrodes enables fully operational devices with thick photoactive layers without increasing the resistance. In some embodiments, increasing the electrode/polymer contact surface area increases efficiency.

Manufacturing

In some embodiments, the electrode is manufactured using a patterning process, followed by heating. In some embodiments, the heating is carried out by sintering, pyrolysis, or baking.

In some embodiments, the electrodes are manufactured by first patterning a conductive powder or polymer. In some embodiments, the patterning consists of two layers. In some embodiments, the bottom layer is for the wire traces that connect a series of anodes and cathodes separately. In some embodiments, the second layer consists of the high-aspect ratio electrodes.

In some embodiments, the patterned polymer or powder is subjected to heating (e.g., sintering, pyrolysis, or baking). As used herein, "sintering" means heating a powder below its melting point until the powder particles adhere to each other. As used herein, "pyrolysis" means chemical decomposition of a condensed substance by heating.

In some embodiments, the conductive or semi-conductive material is a powder. In some embodiments, the polymer is a powder and the heating is carried out by sintering. In some embodiments, sintering results in the powder particles adhering to one another to form a single object. In some embodiments, the sintering comprises the application of heat and pressure to a patterned powder. In some embodiments, the sintering comprises Joule heating and pressure to a patterned powder. In some embodiments, sequential layers of powders are deposited in-situ following each sintering path.

In some embodiments, the sintering is spark-plasma sintering (SPS). In some embodiments, the SPS is administered through a tip. In some embodiments, the tip is at least 1 nm. In some embodiments, the tip is greater than 1 nm. In some embodiments, when there is a small contact area between the tip and the powder bed, the electric current requirement is low. In some embodiments, SPS enables the sintering of nano-powders (and the retention of the nanostructure), micro-powders (and the retention of the microstructure), or macro-powders at low temperatures, in a short amount of time while using much higher heating rates than conventionally possible. In some embodiments, SPS enables shape and size of the electrode to be controlled by controlling the tip size, position, path and speed.

The effect of an electric field on the diffusion flux ($J_1$) in accordance with electromigration theory is detailed in the following equation:

$$J_i = -\frac{D_i C_i}{RT}\left[\frac{RT \partial \ln C_i}{\partial x} + Fz^* E\right]$$

where $D_1$ is the diffusion coefficient, $C_1$ is concentration, F is Faraday's Constant, $z^*$ is the effective charge on diffusing species, T is the temperature, E is the field and R is the gas constant.

In some embodiments, the conductive or semi-conductive material is a polymer. In some embodiments, the heating is carried out by pyrolysis. In some embodiments, pyrolysis occurs under pressure, with no or minimal oxygen (e.g., less than stoichiometric quantities of oxygen), and at operating temperatures above 430° C. In some embodiments, organic materials are transformed into gases, small quantities of liquid, and a solid residue (coke) containing fixed carbon and ash. In some embodiments, pyrolysis occurs in any suitable device (e.g., a rotary kiln, rotary hearth furnace, or fluidized bed furnace).

In some embodiments, once the 3-dimensional electrode is manufactured, a conductive polymer (e.g., poly(3,4-ethylenedioxythiophene) poly(styrenesulfonate) or PEDOT:PSS) must be deposited on the surface of the electrode (e.g., for the manufacture of anodes). In some embodiments, the electrode is manufactured on a wafer, metal or non-metal substrate, sheet or film. In some embodiments, a lithographic technique is used to deposit a thick layer of conductive polymer throughout the wafer, metal or non-metal substrate, sheet or film followed by photolithography to remove all conductive polymer from all regions except in the vicinity (1-2 micron) of the desired electrode.

In some embodiments, depositing a conductive polymer on an electrode requires scoring the electrode surface. In some embodiments, dry gas etching is used to create rough surfaces on the carbon electrodes. In some embodiments, the photo-active-polymer is the spin-coated on the electrode. In some embodiments, the conductive polymer is PEDOT:PSS. In some embodiments, the anode has a work function of 5 eV or higher.

In some embodiments, the electrode has a porous surface. In some embodiments, porosity increases surface area. In some embodiments, the electrode has a non-porous surface.

Materials

In some embodiments, the electrodes comprise a conductive or semi-conductive material. In some embodiments, the electrodes comprise a conductive or semi-conductive material selected from: carbon, a carbon allotrope, or an organic polymer. In some embodiments, the electrodes comprise a conductive or semi-conductive material selected from graphite, diamond, amorphous carbon, buckminsterfullerenes, glassy carbon, carbon nanofoam, lonsdaleite, linear acetylenic carbon, or combinations thereof. In some embodiments, the electrodes comprise graphite. In some embodiments, the electrodes comprise glassy carbon. As opposed to conventional metal electrodes, such as aluminum and indium tin oxide, carbon-based electrodes are cheaper to manufacture. Carbon is abundantly availability—it is the fourth most abundant element on earth. Indium tin oxide is very scarce with world-wide supply projected to last only 10 years. Further, an expensive process is required to obtain a good quality ITO. Additionally, carbon has excellent elecrtrochemical stability, and good thermal and electrical conductivities.

In some embodiments, the electrodes comprise a conductive or semi-conductive material selected from: a metal, a metal alloy, an intermetallic material, a metallic glass, a composite material, a polymer, biocompatible material, or combinations thereof. In some embodiments, the electrodes comprise SU-8 negative photoresist. In some embodiments, the electrodes comprise a metal. In some embodiments, the electrodes comprise a metal alloy. In some embodiments, the electrodes comprise an intermetallic. In some embodiments, the electrodes comprise a metallic glass. In some embodiments, the electrodes comprise a composite material. In some embodiments, the electrodes comprise a biocompatible material. In some embodiments, the electrodes comprise a semiconductor, a superconductor, or a combination thereof.

Methods of Manufacturing

Disclosed herein, in certain embodiments, is a method of manufacturing a three-dimensional electrode comprising: patterning a conductive or semi-conductive material into the desired three-dimensional shape; and heating the patterned conductive or semi-conductive material. In some embodiments, the electrode is made from a polymer precursor. In some embodiments, the electrode is a made from a powder precursor that is consolidated or partially consolidated. In some embodiments, the electrode is made from carbon or a carbon allotrope.

In some embodiments, the electrode is manufactured using a patterning process, followed by heating. In some embodiments, the heating is carried out to sinter, pyrolyze, or bake the precursor.

In some embodiments, the patterning process is any polymer 3D shaping process. In some embodiments, the patterning process is any powder 3D shaping process. In some embodiments, the patterning process is stamping, extrusion, printing, lithography, rolling, or combinations thereof. In some embodiments, the patterning process is ink-jet printing. In some embodiments, the patterning process is stamping. In some embodiments, the patterning process is roll-to-roll. In some embodiments, the patterning process is photolithography.

In some embodiments, the electrodes are manufactured by first patterning a conductive powder or polymer. In some embodiments, the patterning consists of two layers. In some embodiments, the bottom layer is for the wire traces that connect a series of anodes and cathodes separately. In some embodiments, the second layer consists of the high-aspect ratio electrodes.

In some embodiments, the patterned polymer or powder is subjected to heating in order to sinter or pyrolyse and bake the feature. As used herein, "sintering" means heating a powder below its melting point or above the melting point of one or more of its constituents until the powder particles adhere to each other. As used herein, "pyrolysis" means chemical decomposition of a condensed substance by heating.

In some embodiments, the conductive or semi-conductive material is a powder. In some embodiments, the polymer is a powder and the heating is carried-out to sinter the precursor. In some embodiments, sintering results in the powder particles adhering to one another to form a single object. In some embodiments, the sintering comprises the application of heat (via conventional heat or current/field assisted heating) and pressure to a patterned powder. In some embodiments, the sintering comprises Joule heating and pressure to a patterned powder. In some embodiments, the sequential layers of powders are deposited in-situ following each sintering path.

In some embodiments, the sintering is spark-plasma sintering (SPS). In some embodiments, the SPS is administered through a tip. In some embodiments, the tip is at least 1 nm. In some embodiments, the tip is greater than 1 nm. In some embodiments, when there is a small contact area between the tip and the powder bed, the electric current requirement is low. In some embodiments, SPS enables the sintering of nano-powders (and the retention of the nanostructure), micro-powders (and the retention of the microstructure), or macro-powders at low temperatures, in a short amount of time while using much higher heating rates than conventionally possible. In some embodiments, SPS enables shape and size of the electrode to be controlled by controlling the tip size, position, pat, speed, and environment.

In some embodiments, the sintering is conducted in a conventional furnace.

In some embodiments, the sintering of all or part of the patterned features is conducted as a whole by passing electric current to the layered structure In some embodiments, the tip can be used for a dual function, which includes a pyrolysis stage of polymer or powder polymer followed by a sintering stage of the pyrolysed polymer or powder for efficient consolidation of controlled density.

The effect of an electric field on the diffusion flux ($J_1$) in accordance with electromigration theory is detailed in the following equation:

$$J_i = -\frac{D_i C_i}{RT}\left[\frac{RT\partial \ln C_i}{\partial x} + Fz^* E\right]$$

where $D_1$ is the diffusion coefficient, $C_1$ is concentration, F is Faraday's Constant, $z^*$ is the effective charge on diffusing species, T is the temperature, E is the field and R is the gas constant.

In some embodiments, the conductive or semi-conductive material is a polymer. In some embodiments, the heating is applied to pyrolyze the precursor. In some embodiments, pyrolysis occurs under pressure, with no or minimal oxygen (e.g., less than stoichiometric quantities of oxygen), and at operating temperatures above 400° C. In some embodiments, organic materials are transformed into gases, small quantities of liquid, and to solid residue (coke) containing fixed carbon and ash. In some embodiments, pyrolysis occurs in any suitable device (e.g., a rotary kiln, rotary hearth furnace, or fluidized bed furnace).

In some embodiments, once the 3-dimensional electrode is manufactured, a conductive polymer (e.g., poly(3,4-ethylenedioxythiophene) poly(styrenesulfonate) or PEDOT:PSS) must be deposited on the surface of the electrode (e.g., for the manufacture of anodes). In some embodiments, the electrode is manufactured on a wafer, metal or non-metal substrate, sheet or film. In some embodiments, a lithographic technique is used to deposit a thick layer of conductive polymer throughout the wafer, metal or non-metal substrate, sheet or film followed by photolithography to remove all conductive polymer from all regions except in the vicinity (1-2 micron) of the desired electrode.

In some embodiments, depositing a conductive polymer on an electrode requires scoring the electrode surface. In some embodiments, dry gas etching is used to create rough surfaces on the carbon electrodes. In some embodiments, the photo-active-polymer is the spin-coated on the electrode. In some embodiments, the conductive polymer is PEDOT:PSS. In some embodiments, the anode has a work function of 5 eV or higher.

Photovoltaic Cells

Current photovoltaic cells typically consist of a thin photoactive layer (e.g., about 100 nanometers) that is sandwiched between two metal electrodes. In certain instances, the anode is a transparent, conductive metal oxide (e.g., Indium Tin Oxide). In certain instances, the cathode is aluminum.

The current architecture of photovoltaic cells (i.e., planar cells) is such that the electron transfer length is limited to an extremely small region (e.g., about 10 to about 20 nanometers). As a result, photoelectric conversion in organic photovoltaic cells is often limited to these small regions around the interfaces between donors and acceptors of the polymer photoactive blend. Such thin layers have limited absorption even at the peak of their absorption spectrum since the optical absorption length is in the order of a few hundreds of nanometers.

Disclosed herein, in certain embodiments, is a photovoltaic cell comprising: (a) a plurality of three-dimensional electrodes comprising a conductive or semi-conductive material; and (b) at least one photoactive material; wherein the shape of the electrodes varies along the vertical or horizontal axis.

In some embodiments, the photovoltaic cell provides energy conversion efficiency of at least 5%, 10%, 15%, 20%, 25%, 30%, 40% or 50%. In some embodiments, the photovoltaic cell provides energy conversion efficiency of at least 5%. In some embodiments, the photovoltaic cell provides energy conversion efficiency of at least 7%. In some embodiments, the photovoltaic cell provides energy conversion efficiency of at least 10%. In some embodiments, the photovoltaic cell provides energy conversion efficiency of at least 15%. In some embodiments, the photovoltaic cell provides energy conversion efficiency of at least 20%. In some embodiments, the photovoltaic cell provides energy conversion efficiency of at least 25%. In some embodiments, the photovoltaic cell provides energy conversion efficiency of at least 30%. In some embodiments, the photovoltaic cell provides energy conversion efficiency of at least 40%. In some embodiments, the photovoltaic cell provides energy conversion efficiency of at least 50%.

In some embodiments, the electrode is an all-polymer electrode. In some embodiments, the electrodes comprise carbon, a carbon allotrope, or an organic polymer. In some embodiments, the electrodes comprise graphite or glassy carbon. In some embodiments, electromagnetic radiation enters the cell from at least two sides and contacts the photoactive material. In some embodiments, a photovoltaic cell disclosed herein has decreased diffusion length and increased light absorption area.

In some embodiments, the electromagnetic radiation is visible light (i.e., EM having a wavelength from about 380 to about 750 nm). In some embodiments, the electromagnetic radiation is infrared radiation (i.e., EM radiation having a wavelength from about 700 nm to about 1 mm). In some embodiments, the electromagnetic radiation is ultraviolet radiation (i.e., EM radiation having a wavelength from about 10 nm to about 400 nm).

In some embodiments, the electromagnetic radiation is absorbed by the photoactive material. In some embodiments, absorption of the photons excites electrons in a donor polymer, knocking them loose from their orbit. In some embodiments, an electron hole is created when an electron is knocked loose from its orbit. In some embodiments, the hole flows to the anode. In some embodiments, excited electrons migrate to the cathode. In some embodiments, the migration of holes to the anode and electrons to the cathode creates a potential difference. In some embodiments, the diffusion length for migrating charges is less than 100 nm.

Electrodes

In some embodiments, the electrodes are transparent and do not interfere with the ability of electromagnetic radiation to reach the photoactive materials. Current photovoltaic cells utilize ITO-based anodes. In certain instances, ITO-based anodes reduce the light energy transmission enabling more electromagnetic radiation to reach the photoactive materials. Further, current photovoltaic cells utilize aluminum-based cathodes. In certain instances, the aluminum-based cathodes are nontransparent. Thus, in some embodiments, a photovoltaic cell disclosed herein allows the absorption of sun energy from multiple sides of the cell. This structure significantly increases the electrode/photoactive material interactions.

In some embodiments, the first electrode is an anode and the second electrode is a cathode. In some embodiments, the anode has a work function of 5 eV or higher. In some embodiments, the anodes enable hole transport. In some embodiments, the cathode has a work function of less than 5 eV.

In some embodiments, the anode is coated with a thin layer of conducting polymer. In some embodiments, the anode is coated with PEDOT:PSS.

In some embodiments, the three-dimensional electrodes are in the shape of a cylinder, a pyramid, a diamond, sphere, hemisphere, or a rectangular prism. In some embodiments, the three-dimensional electrodes are in the shape of pyramids. In some embodiments, the three-dimensional electrodes are in the shape of cylinders. In some embodiments, utilizing a three-dimensional electrode increases the electrode/polymer contact surface area and hence interaction. In some embodiments, the narrow gap between the three-dimensional electrodes enables fully operational devices with thick photoactive layers without increasing the resistance. In some embodiments, increasing the electrode polymer contact surface area increases efficiency.

In some embodiments, the electrodes are manufactured by first patterning a conductive powder or polymer. In some embodiments, the patterning consists of two layers. In some embodiments, the bottom layer is for the wire traces that connect a series of anodes and cathodes separately. In some embodiments, the second layer consists of the high-aspect ratio electrodes. In some embodiments, patterning occurs via photolithography.

In some embodiments, the electrode is manufactured using a patterning process, followed by heating. In some embodiments, the heating is carried out to sinter, pyrolyze, or bake the precursor.

In some embodiments, the patterning process is any polymer 3D shaping process. In some embodiments, the patterning process is any powder 3D shaping process. In some embodiments, the patterning process is stamping, extrusion, printing, lithography, rolling, or combinations thereof. In some embodiments, the patterning process is ink jet printing. In some embodiments, the patterning process is stamping. In some embodiments, the patterning process is roll-to-roll. In some embodiments, the patterning process is photolithography.

In some embodiments, the patterned polymer or powder is subjected to heating in order to sinter or pyrolyse and bake the feature. As used herein, "sintering" means heating a powder below its melting point or above the melting point of one or more of its constituents until the powder particles adhere to each other. As used herein, "pyrolysis" means chemical decomposition of a condensed substance by heating.

In some embodiments, the conductive or semi-conductive material is a powder. In some embodiments, the polymer is a powder and the heating is carried-out to sinter the precursor. In some embodiments, sintering results in the powder particles adhering to one another to form a single object. In some embodiments, the sintering comprises the application of heat (via conventional heat or current/field assisted heating) and pressure to a patterned powder. In some embodiments, the sintering comprises Joule heating and pressure to a patterned powder. In some embodiments, the sequential layers of powders are deposited in-situ following each sintering path.

In some embodiments, the sintering is spark-plasma sintering (SPS). In some embodiments, the SPS is administered through a tip. In some embodiments, the tip is at least 1 nm. In some embodiments, the tip is greater than 1 nm. In some embodiments, when there is a small contact area between the tip and the powder bed, the electric current requirement is low. In some embodiments, SPS enables the sintering of nano-powders (and the retention of the nanostructure), micro-powders (and the retention of the microstructure), or macro-powders at low temperatures, in a short amount of time while using much higher heating rates than conventionally possible. In some embodiments, SPS enables shape and size of the electrode to be controlled by controlling the tip size, position, pat, speed, and environment.

In some embodiments, the sintering is conducted in a conventional furnace.

In some embodiments, the sintering of all or part of the patterned features is conducted as a whole by passing electric current to the layered structure In some embodiments, the tip can be used for a dual function, which includes a pyrolysis stage of polymer or powder polymer followed by a sintering stage of the pyrolysed polymer or powder for efficient consolidation of controlled density.

The effect of an electric field on the diffusion flux ($J_1$) in accordance with electromigration theory is detailed in the following equation:

$$J_i = -\frac{D_i C_i}{RT}\left[\frac{RT\partial \ln C_i}{\partial x} + Fz^* E\right]$$

where $D_1$ is the diffusion coefficient, $C_1$ is concentration, F is Faraday's Constant, $z^*$ is the effective charge on diffusing species, T is the temperature, E is the field and R is the gas constant.

In some embodiments, the conductive or semi-conductive material is a polymer. In some embodiments, the heating is applied to pyrolyze the precursor. In some embodiments, pyrolysis occurs under pressure, with no or minimal oxygen (e.g., less than stoichiometric quantities of oxygen), and at operating temperatures above 400° C. In some embodiments, organic materials are transformed into gases, small quantities of liquid, and a solid residue (coke) containing fixed carbon and ash. In some embodiments, pyrolysis occurs in any suitable device (e.g., a rotary kiln, rotary hearth furnace, or fluidized bed furnace).

In some embodiments, once the 3-dimensional electrode is manufactured, a conductive polymer (e.g., poly(3,4-ethylenedioxythiophene) poly(styrenesulfonate) or PEDOT:PSS) must be deposited on the surface of the electrode (e.g., for the manufacture of anodes). In some embodiments, the electrode is manufactured on a wafer, metal or non-metal substrate, sheet or film. In some embodiments, a lithographic technique is used to deposit a thick layer of conductive polymer throughout the wafer, metal or non-metal substrate, sheet or film followed by photolithography to remove all conductive polymer from all regions except in the vicinity (1-2 micron) of the desired electrode.

In some embodiments, depositing a conductive polymer on an electrode requires scoring the electrode surface. In some embodiments, dry gas etching is used to create rough surfaces on the carbon electrodes. In some embodiments, the photoactive-polymer is the spin-coated on the electrode. In some embodiments, the conductive polymer is PEDOT:PSS. In some embodiments, the anode has a work function of 5 eV or higher.

In some embodiments, the electrode is porous. In some embodiments, porosity increases surface areas of the electrode.

In some embodiments, the electrodes comprise a conductive or semi-conductive or semi-conductive material. In some embodiments, the electrodes comprise a conductive or semi-conductive or semi-conductive material selected from: carbon, a carbon allotrope, or an organic polymer. In some embodiments, the electrodes comprise a conductive or semi-conductive or semi-conductive material selected from graphite, diamond, amorphous carbon, buckminsterfullerenes, glassy carbon, carbon nanofoam, lonsdaleite, linear acetylenic carbon, or combinations thereof. In some embodiments, the electrodes comprise graphite. In some embodiments, the electrodes comprise glassy carbon. As opposed to conventional metal electrodes, such as aluminum and indium tin oxide, carbon-based electrodes are cheaper to manufacture. Carbon is abundantly availability—it is the fourth most abundant element on earth. Indium tin oxide is very scarce with world-wide supply projected to last only 10 years. Further, an expensive process is required to obtain a good quality ITO. Additionally, carbon has excellent electrochemical stability, and good thermal and electrical conductivities.

In some embodiments, the electrodes comprise a conductive or semi-conductive or semi-conductive material selected from: a metal, a metal alloy, an intermetallic material, a metallic glass, a composite material, a polymer, biocompatible material, or combinations thereof. In some embodiments, the electrodes comprise SU-8 negative photoresist.

In some embodiments, the electrodes comprise a metal. In some embodiments, the electrodes comprise a metal alloy. In some embodiments, the electrodes comprise an intermetallic. In some embodiments, the electrodes comprise a metallic glass. In some embodiments, the electrodes comprise a composite material. In some embodiments, the electrodes comprise a biocompatible material. In some embodiments, the electrodes comprise a semiconductor, a superconductor, or a combination thereof.

In some embodiments, the sizes of individual 3D electrodes are from a few nanometers to several mm. In some embodiments, the spacing between electrodes is from a few nanometers to several mm.

Photoactive Material

In some embodiments, the photoactive material surrounds the first electrode and the second electrode.

In some embodiments, the first photoactive material comprises a matrix of heterojunction photoactive material. In some embodiments, the first photoactive material comprises crystalline silicone, cadmium telluride, copper-indium selenide, copper indium/gallium diselenide, ruthenium metalorganic dye, P3HT (poly(3-hexylthiophene)), PCBM (phenyl-C61-butyric acid methyl ester), or combinations thereof. In some embodiments, the photoactive material comprises P3HT (poly(3-hexylthiophene)) and PCBM (phenyl-C61-butyric acid methyl ester). In some embodiments, the photoactive material comprises P3HT (poly(3-hexylthiophene)) and PCBM (phenyl-C61-butyric acid methyl ester) in a 1:1 ratio by weight.

In some embodiments, the 3D architecture of the cell supports multiple photoactive layers. In some embodiments, the cell further comprises a second photoactive material; and wherein the absorption spectrum of the first photoactive material and the absorption of the second photoactive material are different. In some embodiments, the use of multiple photoactive layers enables increased absorption of photonic energy and hence increased efficiency. In certain instances, visible light tends to have an average of 51% of photon energy whereas infrared (IR) could have as much as 45% of photon energy. Thus, in some embodiments, the introduction of a varying depth of photoactive region will enable the harvesting of more bandwidth in the spectrum.

In some embodiments, the surface area of the photoactive material is increased by a factor of about 3 to about 6.

Patterns of the Electrodes on the Wafer, Metal or Non-metal Substrate, Sheet or Film In some embodiments, the first electrode and the second electrode are arranged in a plain structure.

In some embodiments, the first electrode and the second electrode are arranged in a grouped pattern.

In some embodiments, the first electrode and the second electrode are arranged in a separated pattern.

In some embodiments, the electrodes are formed in a no trace architecture. In some embodiments, the diodes is formed with a trace architecture. As used herein, "trace", means the equivalent of a wire for conducting signals. In some embodiments, a trace consists of a flat, narrow part of the copper foil that remains after etching.

In some embodiments, the cell has a single layer of photoactive material and no trace pattern. In some embodiments, the cell has a single layer of photoactive material and a separated pattern. In some embodiments, the cell has a single layer of photoactive material and a grouped pattern.

In some embodiments, the cell has more than one layer of photoactive material and no trace pattern. In some embodiments, the cell has more than one layer of photoactive material and a separated pattern. In some embodiments, the chip has more than one layer of photoactive material and a grouped pattern.

Transparent Material

In some embodiments, the photovoltaic cell is surrounded by a transparent material, wherein the transparent material protects the cell from oxidation. In some embodiments, the photovoltaic cell is surrounded by a transparent material of glass, plastic, ceramic or a combination thereof. In some embodiments, the photovoltaic cell is surrounded by a transparent material of glass, wherein the glass protects the cell from oxidation. In some embodiments, the photovoltaic cell is surrounded by a transparent material of plastic, wherein the glass protects the cell from oxidation.

Uses

In some embodiments, the cell is used to make a solar module. As used herein, a "solar module" means an interconnected assembly of solar cells.

II. Diodes

Disclosed herein, in certain embodiments, is a three dimensional diode comprising a transparent conductive or semi-conductive or semi-conductive material, wherein the shape of the diode varies along the vertical axis. In some embodiments, the diode is an all-polymer diode.

In some embodiments, the photovoltaic cell provides energy conversion efficiency of at least 5%, 10%, 15%, 20%, 25%, 30%, 40% or 50%. In some embodiments, the photovoltaic cell provides energy conversion efficiency of at least 5%. In some embodiments, the photovoltaic cell provides energy conversion efficiency of at least 7%. In some embodiments, the photovoltaic cell provides energy conversion efficiency of at least 10%. In some embodiments, the photovoltaic cell provides energy conversion efficiency of at least 15%. In some embodiments, the photovoltaic cell provides energy conversion efficiency of at least 20%. In some embodiments, the photovoltaic cell provides energy conversion efficiency of at least 25%. In some embodiments, the photovoltaic cell provides energy conversion efficiency of at least 30%. In some embodiments, the photovoltaic cell provides energy conversion efficiency of at least 40%. In some embodiments, the photovoltaic cell provides energy conversion efficiency of at least 50%.

In some embodiments, the diode comprises carbon, a carbon allotrope, or an organic polymer. In some embodiments, the diode comprises graphite or glassy carbon. In some embodiments, the diode comprises an anode and a cathode.

Shape

In some embodiments, the diode is in the shape of a cylinder, a pyramid, a diamond, sphere, hemisphere, or a rectangular prism. In some embodiments, the diode is in the shape of a pyramid. In some embodiments, the three-dimensional electrodes are in the shape of cylinders.

Manufacturing

In some embodiments, the diodes are manufactured by first patterning a conductive powder or polymer. In some embodiments, the patterning consists of two layers. In some embodiments, the bottom layer is for the wire traces that connect a series of diode. In some embodiments, the second layer consists of the high-aspect ratio diodes.

In some embodiments, the patterning process is any polymer 3D shaping process. In some embodiments, the patterning process is any powder 3D shaping process. In some embodiments, the patterning process is stamping, extrusion, printing, lithography, rolling, or combinations thereof. In some embodiments, the patterning process is ink-jet printing. In some embodiments, the patterning process is stamping. In some embodiments, the patterning process is roll-to-roll. In some embodiments, the patterning process is photolithography.

In some embodiments, the patterned polymer or powder is subjected to heating (e.g., sintering, pyrolysis, or baking). As used herein, "sintering" means heating a powder below its melting point until the powder particles adhere to each other. As used herein, "pyrolysis" means chemical decomposition of a condensed substance by heating.

In some embodiments, the conductive or semi-conductive or semi-conductive material is a powder. In some embodiments, the polymer is a powder and the heating is carried out by sintering. In some embodiments, sintering results in the powder particles adhering to one another to form a single object. In some embodiments, the sintering comprises the application of heat and pressure to a patterned powder. In some embodiments, the sintering comprises Joule heating and pressure to a patterned powder. In some embodiments, the sequential layers of powders are deposited in-situ following each sintering path.

In some embodiments, the sintering is spark-plasma sintering (SPS). In some embodiments, the SPS is administered through a tip. In some embodiments, the tip is about 1 nm. In some embodiments, the tip is greater than 1 nm. In some embodiments, when there is a small contact area between the tip and the powder bed, the electric current requirement is low. In some embodiments, SPS enables the sintering of nano-powders (and the retention of the nanostructure), micro-powders (and the retention of the microstructure), or macro-powders at low temperatures, in a short amount of time while using much higher heating rates than conventionally possible. In some embodiments, SPS enables shape and size of the diode to be controlled by controlling the tip size, position, path and speed.

The effect of an electric field on the diffusion flux ($J_1$) in accordance with electromigration theory is detailed in the following equation:

$$J_i = -\frac{D_i C_i}{RT}\left[\frac{RT \partial \ln C_i}{\partial x} + F z^* E\right]$$

where $D_1$ is the diffusion coefficient, $C_1$ is concentration, F is Faraday's Constant, $z^*$ is the effective charge on diffusing species, T is the temperature, E is the field and R is the gas constant.

In some embodiments, the conductive or semi-conductive or semi-conductive material is a polymer. In some embodiments, the heating is carried out by pyrolysis. In some embodiments, pyrolysis occurs under pressure, with no or minimal oxygen (e.g., less than stoichiometric quantities of oxygen), and at operating temperatures above 430° C. In some embodiments, organic materials are transformed into gases, small quantities of liquid, and a solid residue (coke) containing fixed carbon and ash. In some embodiments, pyrolysis occurs in any suitable device (e.g., a rotary kiln, rotary hearth furnace, or fluidized bed furnace).

In some embodiments, once the 3-dimensional diode is manufactured, a conductive polymer (e.g., poly(3,4-ethylenedioxythiophene) poly(styrenesulfonate) or PEDOT:PSS) must be deposited on part or all of the surface of the diode (e.g., for the manufacture of the anode portion). In some embodiments, the diode is manufactured on a wafer, metal or non-metal substrate, sheet or film. In some embodiments, a lithographic technique is used to deposit a thick layer of conductive polymer throughout the wafer, metal or non-metal substrate, sheet or film followed by photolithography to remove all conductive polymer from all regions except in the vicinity (1-2 micron) of the desired diode.

In some embodiments, depositing a conductive polymer on a diode requires scoring the diode surface. In some embodiments, dry gas etching is used to create rough surfaces on the carbon diodes. In some embodiments, the photoactive-polymer is the spin-coated on the diode. In some embodiments, the conductive polymer is PEDOT:PSS. In some embodiments, the anode has a work function of 5 eV or higher.

In some embodiments, the diode is porous. In some embodiments, porosity increases surface area.

Materials

In some embodiments, the diodes comprise a conductive or semi-conductive or semi-conductive material. In some embodiments, the diodes comprise a conductive or semi-conductive material selected from: carbon, a carbon allotrope, or an organic polymer. In some embodiments, the diodes comprise a conductive or semi-conductive material selected from graphite, diamond, amorphous carbon, buckminsterfullerenes, glassy carbon, carbon nanofoam, lonsdaleite, linear acetylenic carbon, or combinations thereof. In some embodiments, the diode comprises graphite. In some embodiments, the diode comprises glassy carbon. As opposed to conventional metal diodes, such as aluminum and indium tin oxide, carbon-based diodes are cheaper to manufacture. Carbon is abundantly availability—it is the fourth most abundant element on earth. Indium tin oxide is very scarce with world-wide supply projected to last only 10 years. Further, an expensive process is required to obtain a good quality ITO. Additionally, carbon has excellent electrochemical stability, and good thermal and electrical conductivities.

In some embodiments, the diodes comprise a conductive or semi-conductive material selected from: a metal, a metal alloy, an intermetallic material, a metallic glass, a composite material, a polymer, biocompatible material, or combinations thereof. In some embodiments, the diodes comprise SU-8 negative photoresist. In some embodiments, the diode comprises a metal. In some embodiments, the diode comprises a metal alloy. In some embodiments, the diode comprises an intermetallic. In some embodiments, the diode comprises a metallic glass. In some embodiments, the diode comprises a composite material. In some embodiments, the diode comprises a biocompatible material. In some embodiments, the diode comprises a semiconductor, a superconductor, or a combination thereof.

Conductive Polymer Coatings

In some embodiments, the anode is coated with a thin layer of conducting polymer. In some embodiments, the anode is coated with PEDOT:PSS.

Methods of Manufacturing

Disclosed herein, in certain embodiments, is a method of manufacturing a three-dimensional diode comprising: patterning a conductive or semi-conductive material into the desired three-dimensional shape; and heating the patterned conductive or semi-conductive material. In some embodiments, the diode is an all-polymer diode. In some embodiments, the diode comprises carbon, a carbon allotrope, or an organic polymer. In some embodiments, the diode comprises graphite or glassy carbon.

In some embodiments, the patterning process is any polymer 3D shaping process. In some embodiments, the patterning process is any powder 3D shaping process. In some embodiments, the patterning process is stamping, extrusion, printing, lithography, rolling, or combinations thereof. In some embodiments, the patterning process is inkjet printing. In some embodiments, the patterning process is stamping. In some embodiments, the patterning process is roll-to-roll. In some embodiments, the patterning process is photolithography.

In some embodiments, the heating is carried out by sintering, pyrolysis, or baking.

In some embodiments, the conductive or semi-conductive material is a powder. In some embodiments, the polymer is a powder and the heating is carried out by sintering. In some embodiments, sintering results in the consolidation of the powder into a single object. In some embodiments, the sintering comprises the application of heat and pressure. In some embodiments, the sintering comprises Joule heating and pressure. In some embodiments, the sintering is spark-plasma sintering. In some embodiments, sequential layers of powders are deposited in-situ following each sintering path.

In some embodiments, the sintering is administered through a tip. In some embodiments, the tip is 1 nm. In some embodiments, the tip is greater than 1 nm. In some embodiments, the sintering is controlled by varying tip size, position, path and speed.

In some embodiments, the conductive or semi-conductive material is a polymer. In some embodiments, the heating is carried out by pyrolysis. In some embodiments, pyrolysis occurs under pressure, with no or minimal oxygen (e.g., less than stoichiometric quantities of oxygen), and at operating temperatures above 430° C. In some embodiments, organic materials are transformed into gases, small quantities of liquid, and a solid residue (coke) containing fixed carbon and ash. In some embodiments, pyrolysis occurs in any suitable device (e.g., a rotary kiln, rotary hearth furnace, or fluidized bed furnace).

In some embodiments, the method further comprises scoring the diode. In some embodiments, the diode is scored by dry gas etching. In some embodiments, the method further comprises depositing a photoactive polymer on part of the diode. In some embodiments, the photoactive polymer is PEDOT:PSS.

LED Cells

Disclosed herein, in certain embodiments, is an electroluminescent cell comprising: (a) a plurality of three-dimensional diodes comprising a conductive or semi-conductive material; and (b) a current source; wherein the shape of the diodes varies along the vertical axis, and wherein the electroluminescent cell provides energy conversion efficiency of at least 10%. In some embodiments, the diode is an all-polymer electrode. In some embodiments, the diode comprises carbon, a carbon allotrope, or an organic polymer. In some embodiments, the diode comprises graphite or glassy carbon. In some embodiments, the cell is an organic LED. In some embodiments, the diode is transparent.

In some embodiments, the first polymer is the donor material. In some embodiments, the donor material emits electrons. In some embodiments, the second polymer is the acceptor material. In some embodiments, the acceptor material comprises holes. In some embodiments an electron recombines with a hole. In some embodiments, the recombining of an electron and a hole results in the electron falling into a lower energy level. In some embodiments, the falling of the electron into a lower energy level releases a photon.

Diodes

In some embodiments, the diode comprises an anode and a cathode. In some embodiments, the anode is coated with a thin layer of conducting polymer. In some embodiments, the anode is coated with PEDOT:PSS.

In some embodiments, the three-dimensional diode is in the shape of a cylinder, a pyramid, a diamond, sphere, hemisphere, or a rectangular prism. In some embodiments, the three-dimensional diode is in the shape of a pyramid. In some embodiments, the three-dimensional electrodes are in the shape of cylinders.

In some embodiments, the electrodes are manufactured by first patterning a conductive powder or polymer. In some embodiments, the patterning consists of two layers. In some embodiments, the bottom layer is for the wire traces that connect a series of anodes and cathodes separately. In some embodiments, the second layer consists of the high-aspect ratio electrodes. In some embodiments, patterning occurs via photolithography.

In some embodiments, the patterning process is any polymer 3D shaping process. In some embodiments, the patterning process is any powder 3D shaping process. In some embodiments, the patterning process is stamping, extrusion, printing, lithography, rolling, or combinations thereof. In some embodiments, the patterning process is inkjet printing. In some embodiments, the patterning process is stamping. In some embodiments, the patterning process is roll-to-roll. In some embodiments, the patterning process is photolithography.

In some embodiments, the patterned polymer or powder is subjected to heating (e.g., sintering, pyrolysis, or baking). As used herein, "sintering" means heating a powder below its melting point until the powder particles adhere to each other. As used herein, "pyrolysis" means chemical decomposition of a condensed substance by heating.

In some embodiments, the conductive or semi-conductive material is a powder. In some embodiments, the polymer is a powder and the heating is carried out by sintering. In some embodiments, the sintering results in the consolidation of the powder into a single object. In some embodiments, the sintering comprises the application of heat and pressure. In some embodiments, the sintering comprises Joule heating and pressure. In some embodiments, the sintering is spark-plasma sintering. In some embodiments, the sequential layers of powders are deposited in-situ following each sintering path.

In some embodiments, the sintering is administered through a tip. In some embodiments, the tip is 1 nm. In some embodiments, the tip is greater than 1 nm. In some embodiments, the sintering is controlled by varying tip size, position, path and speed.

In some embodiments, the conductive or semi-conductive material is a polymer. In some embodiments, the heating is carried out by pyrolysis. In some embodiments, pyrolysis occurs under pressure, with no or minimal oxygen (e.g., less than stoichiometric quantities of oxygen), and at operating temperatures above 430° C. In some embodiments, organic materials are transformed into gases, small quantities of liquid, and a solid residue (coke) containing fixed carbon and ash. In some embodiments, pyrolysis occurs in any suitable device (e.g., a rotary kiln, rotary hearth furnace, or fluidized bed furnace).

In some embodiments, the part or all of the diode is scored. In some embodiments, part or all of the diode is scored by dry gas etching. In some embodiments, part or all of the diode further comprises a photoactive polymer. In some embodiments, the photoactive polymer is PEDOT:PSS.

In some embodiments, the diodes comprise a conductive or semi-conductive material. In some embodiments, the diodes comprise a conductive or semi-conductive material selected from: carbon, a carbon allotrope, or an organic polymer. In some embodiments, the diodes comprise a conductive or semi-conductive material selected from graphite, diamond, amorphous carbon, buckminsterfullerenes, glassy carbon, carbon nanofoam, lonsdaleite, linear acetylenic carbon, or combinations thereof. In some embodiments, the diode comprises graphite. In some embodiments, the diode comprises glassy carbon. As opposed to conventional metal diodes, such as aluminum and indium tin oxide, carbon-based diodes are cheaper to manufacture. Carbon is abundantly availability—it is the fourth most abundant element on earth. Indium tin oxide is very scarce with world-wide supply projected to last only 10 years. Further, an expensive process is required to obtain a good quality ITO. Additionally, carbon has excellent electrochemical stability, and good thermal and electrical conductivities.

In some embodiments, the diodes comprise a conductive or semi-conductive material selected from: a metal, a metal alloy, an intermetallic material, a metallic glass, a composite material, a polymer, biocompatible material, or combinations thereof. In some embodiments, the diodes comprise SU-8 negative photoresist. In some embodiments, the diode comprises a metal. In some embodiments, the diode comprises a metal alloy. In some embodiments, the diode comprises an intermetallic. In some embodiments, the diode comprises a metallic glass. In some embodiments, the diode comprises a composite material. In some embodiments, the diode comprises a biocompatible material. In some embodiments, the diode comprises a semiconductor, a superconductor, or a combination thereof.

In some embodiments, the diode is porous. In some embodiments, porosity increases surface area.

In some embodiments, the sizes of individual 3D diodes are from a few nanometers to several mm. In some embodiments, the spacing between diodes is from a few nanometers to several mm.

Patterns of the Diodes on the Wafer, Metal or Non-metal Substrate, Sheet or Film In some embodiments, the cell comprises more than one diode.

In some embodiments, a first electrode and a second diode are arranged in a plain structure.

In some embodiments, a first diode and a diode electrode are arranged in a grouped pattern.

In some embodiments, a first diode and a second diode are arranged in a separated pattern.

In some embodiments, the electrodes are formed in a no trace architecture. In some embodiments, the diodes is formed with a trace architecture. As used herein, "trace", means the equivalent of a wire for conducting signals. In some embodiments, a trace consists of a flat, narrow part of the copper foil that remains after etching.

Transparent Material

In some embodiments, the electroluminescent cell is surrounded by a transparent material, wherein the transparent material protects the cell from oxidation. In some embodiments, the electroluminescent cell is surrounded by a transparent material of glass, plastic, ceramic or a combination thereof. In some embodiments, the electroluminescent cell is surrounded by a transparent material of glass, wherein the glass protects the cell from oxidation. In some embodiments, the electroluminescent cell is surrounded by a transparent material of plastic, wherein the glass protects the cell from oxidation.

Uses

In some embodiments, the cell is used to make a flexible display, a light source, a wall decoration, or a light-emitting cloth.

EXAMPLES

Example 1

Organic Photovoltaic Cell

Fabrication

C-MEMS (Organic MEMS) process was used for the microfabrication of 3-D electrode microarray. Three-dimensional photoresist-derived carbon electrodes with a height of 200 μm on top of a silicon substrate were obtained by using conventional photolithography followed by pyrolysis. The electrodes have 150 μm diameter with 350 μm spacing and traces of 75 μm width and bump pad of 1 mm×1 mm size. Due to shrinkage during pyrolysis, photoresist layer for the electrode posts was spin-coated with a thickness of 220 μm initially to obtain final height of 200 μm. The overall chip size is 1 cm×1 cm.

Materials

PCBM was purchased from Nano-C (Westwood, Mass.) and used without further purification. P3HT was purchased from Ricks Metal Inc., (Lincoln, Nebr.). PEDOT:PSS (poly-3,4-ethylenedioxy-thiophene) was bought from Sigma-Aldrich (St. Louis, Mo.). The solvent dichlorobenzene was bought from Sigma-Aldrich (St. Louis, Mo.).

Preparation of Materials

A blend of P3HT/PCBM was prepared by mixing P3HT and PCBM in 1:1 ratio by weight and dissolving the mixture in chlorobenzene. 0.0133 grams of P3HT and PCBM each was dissolved in 1 mL of dichlorobenzene solution and was incubated for 27 hours. The mix was shook for 3 hours inside the incubator. Additional 0.0133 grams of each was then added to the mix and then shook for another 48 hours.

Dispensing of Materials

The substrate was cleaned in an ultrasonic bath of acetone (high performance liquid chromatography (HPLC) grade) for 20 min, followed by isopropyl alcohol (IPA) (HPLC grade) rinsing for 20 minutes at room temperature, before being dried in a nitrogen gas flow. The cathodes were masked by a photoresist. The PEDOT:PSS was applied through spin-coating layer was then dried at 120° C. for 5 min.

The photoactive layer, consisting of a blend of P3HT and PCBM was then applied on the chip substrate using 40 micro liter pipette covering the PEDOT:PSS and pyrolysed carbon layer (for anodes) and just the pyrolysed carbon layer for cathodes. This was done at room temperature under a fume hood and there was no shaking or stirring. Half of the chips were dried under air through convection for 2.5 hours while the remaining half were dried on a hot plate heated to 65° C. for 20 minutes. Several layers of photoactive material were deposited to reach the 200 μm depth. The thickness of each polymer blend layer was about 30 μm each resulting in seven layers.

Wire Bonding—This was done before the deposition of PEDOT:PSS and the polymer blend. We used a wire bonder with the stage heated at 100° C. for 2 hours using 1:1 volume of two conducting epoxy resins. After drying, conducting glue was applied and further dried for 15 minutes at 100° C.

Testing and Measurements

A total of four types were made. Each chip was tested by putting the chips on a flat surface and expose to 1000 W/m2 with AM 1.5 filter. The wires were connected to a multi-meter. The chips were rotated both in the horizontal and vertical planes to determine the most optimum current generation conditions. In the horizontal plane, 45° was found to be optimum whereas in the vertical plane, readings are taken every 10° until 45°.

Figure 27A:
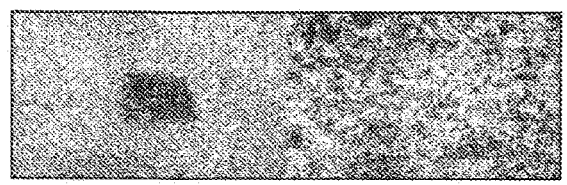
FIGS. 27A and 27B show the details of four tested chips.

The control chip had four wires each connected to four sets of five electrodes. Two sets of five electrodes that serve as anodes were covered with PEDOT:PSS. The chip had seven layers. The bottom six layers had good structure. The last layer showed globules which are suspected to be crystals. See FIG. 27A.

Figure 27B:
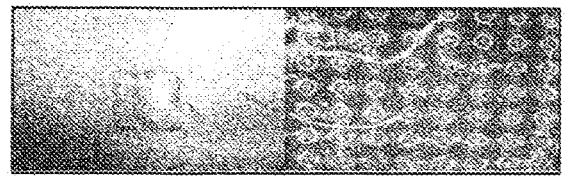

The spider chip had five layers. The chip had a row of five electrodes that were connected to form cathodes and another row of five electrodes that were connected to form anodes. Further, the cell comprised two wires connecting cathodes and anodes. The electrodes were diamond shaped and heat treated. See FIG. 27B.

Figure 27C:
FIG. 27C shows the details of a chip that had three layers; the chip had ten rows of five electrodes (i.e., 50 electrodes) that were connected to form anodes, cathodes were formed in a similar fashion, the electrodes were diamond shaped and heat treated.

The heat treated 50C+50A cell had three layers. The chip had ten rows of five electrodes (i.e. 50 electrodes) that were connected to form anodes. Cathodes were formed in a similar fashion. The electrodes were diamond shaped and heat treated. See FIG. 27C.

Figure 27D:
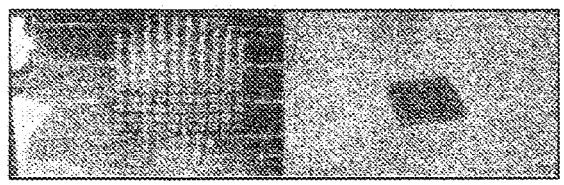
FIG. 27D shows the details of a chip that had ten rows of five electrodes (i.e., 50 electrodes) that were connected to form anodes, cathodes were formed in a similar fashion; the he electrodes were diamond shaped and were not heat treated.

The heat treated 50C+50A cell had three layers. The chip had ten rows of five electrodes (i.e. 50 electrodes) that were connected to form anodes. Cathodes were formed in a similar fashion. The electrodes were diamond shaped and were not heat treated. See FIG. 27D.

Example 2

Surface Morphology

Figure 12A:
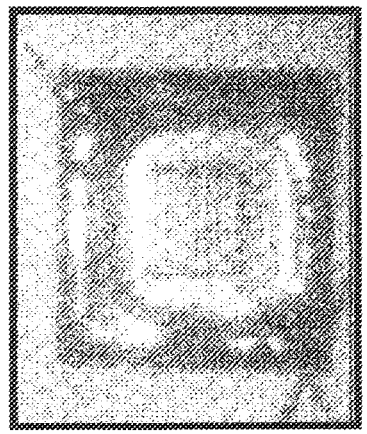
FIG. 12A shows a completed all-photovoltaic cell with a 10×10 array of 3-D graphite electrodes.
Figure 12B:
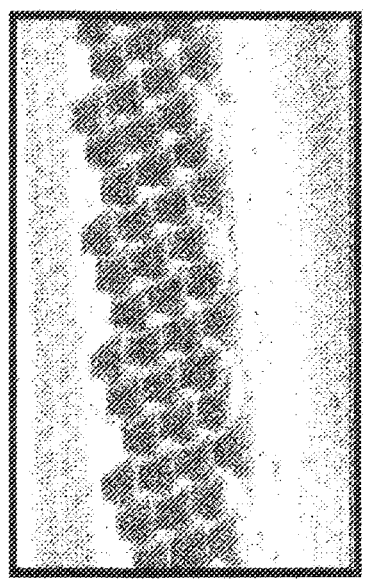
FIG. 12B is an SEM image of a sample anode after PEDOT:PSS was applied.

The surface morphology of the different chips was investigated using optical microscopy after the application of photovoltaic blend and PEDOT:PSS layer. FIG. 12 shows one such result with optical microscopy images of one of the chip sets (10×10 array) after five layers of photoactive blend are added.

5×5 and 10×10 arrays of 3-D electrodes with one, two, and five layers of a photoactive polymer blend were generated. It was observed that heat treatment tends to offer a smoother topology whereas air-dried photoactive materials tend to desegregate into their constituent P3HT and PCBM.

Example 3

Photovoltaic Properties

The samples were subjected to light intensity of 1000 W/m2 with AM1.5 filter and the current generated is measured by multi-meter.

We investigated the influence of a number of parameters on the photovoltaic response of the new chip. These parameters are: depth and number of photoactive of layer, heat treatment, number of electrodes wired for charge collections (5/10/50 cathodes/anodes), effect of PEDOT:PSS.

Figure 13B:
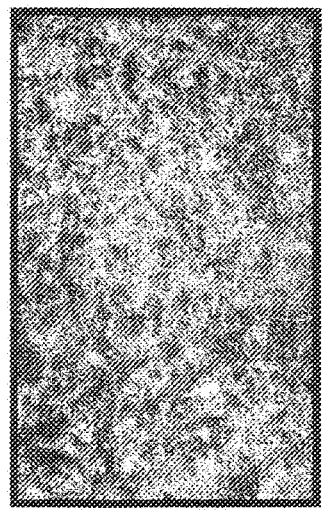
FIGS. 13A and 13B show images of 3-D graphite electrodes with photoactive materials.
Figure 13A:
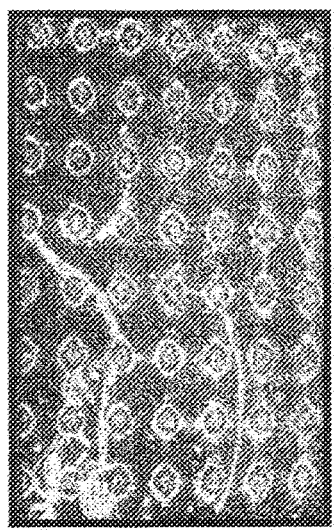
Figure 14:
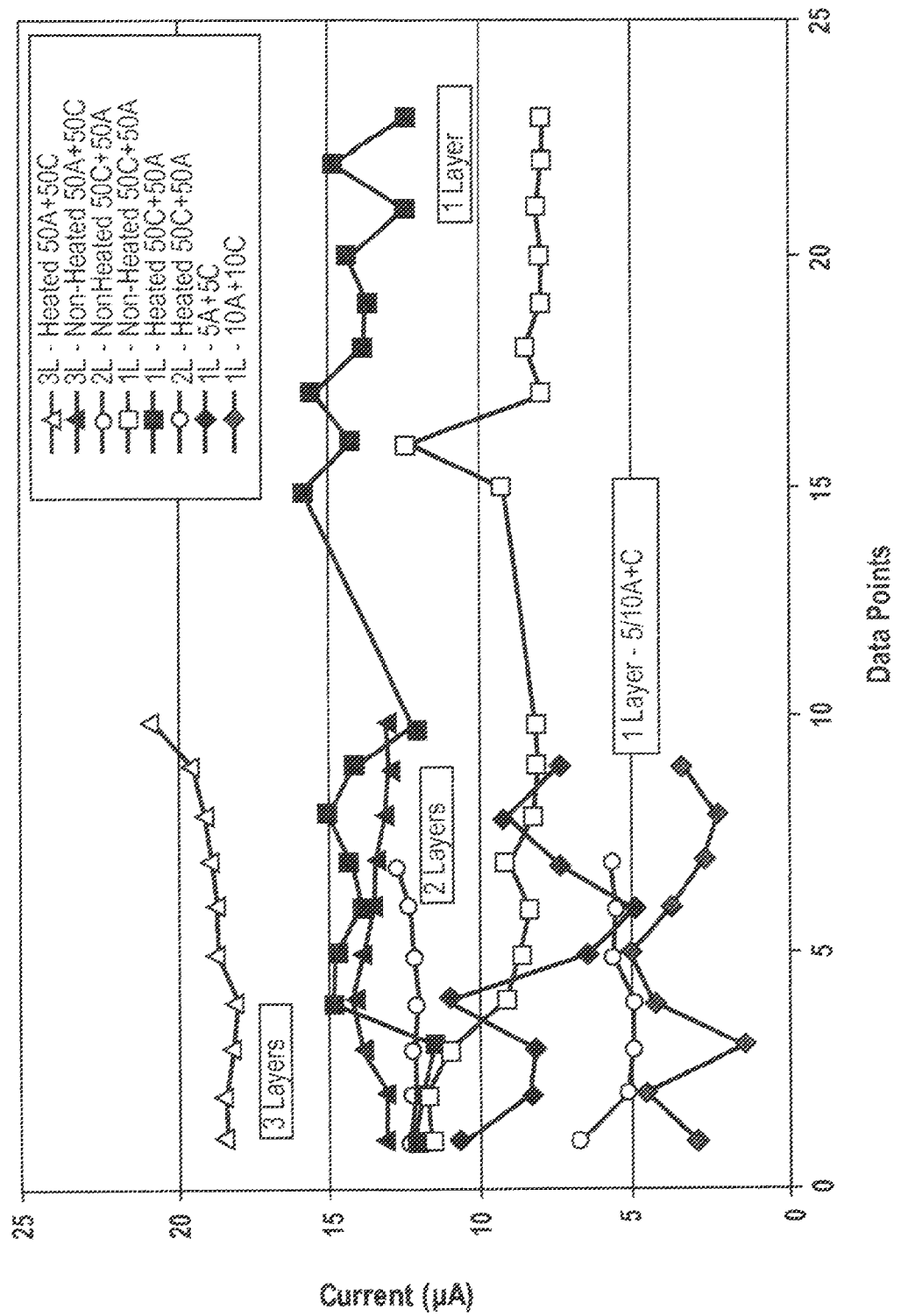
FIG. 14 shows the current reading for 5A+5C, 1OA+1OC, and 50A+50C (1-3 layers).
Figure 15:
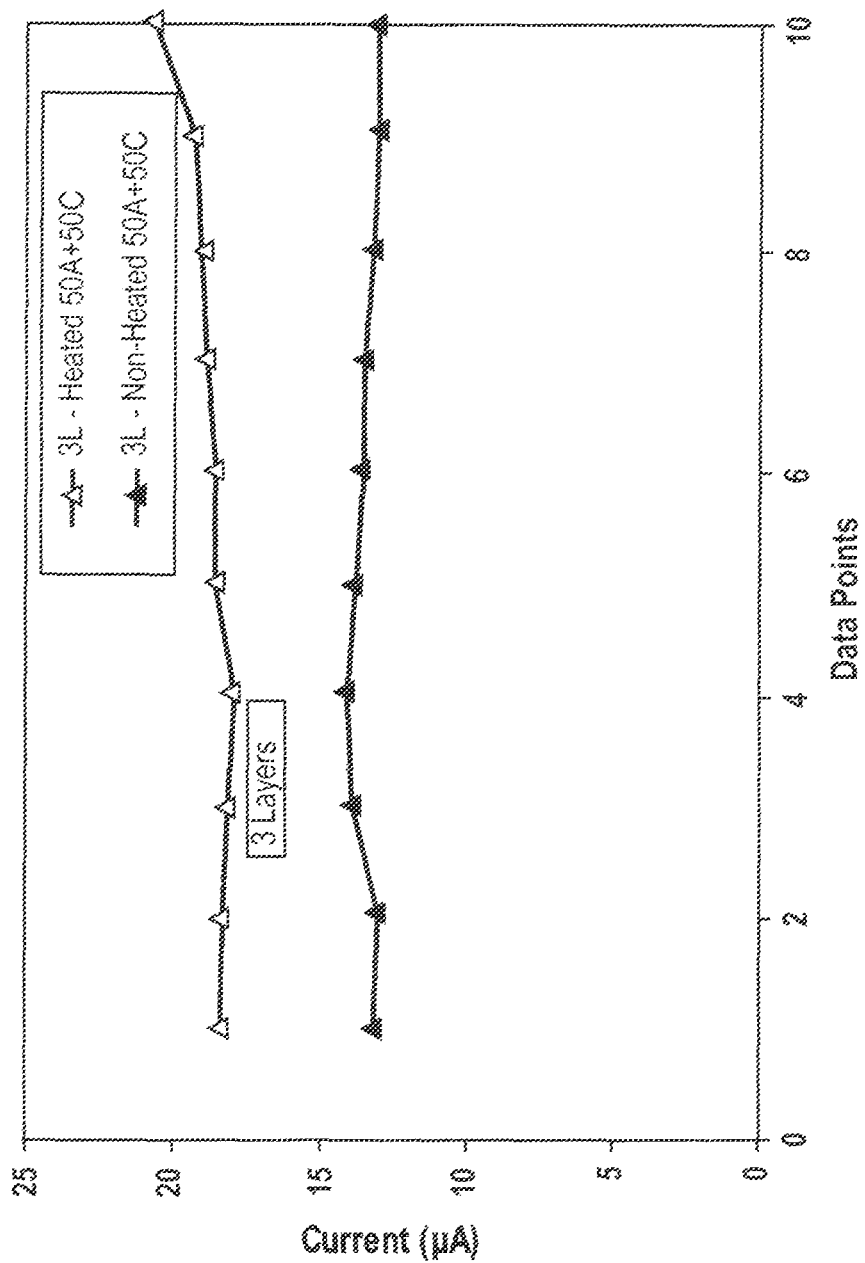
FIG. 15 shows the current reading for 50A+50C (3 layers) showing effect of heat treatment.
Figure 16:
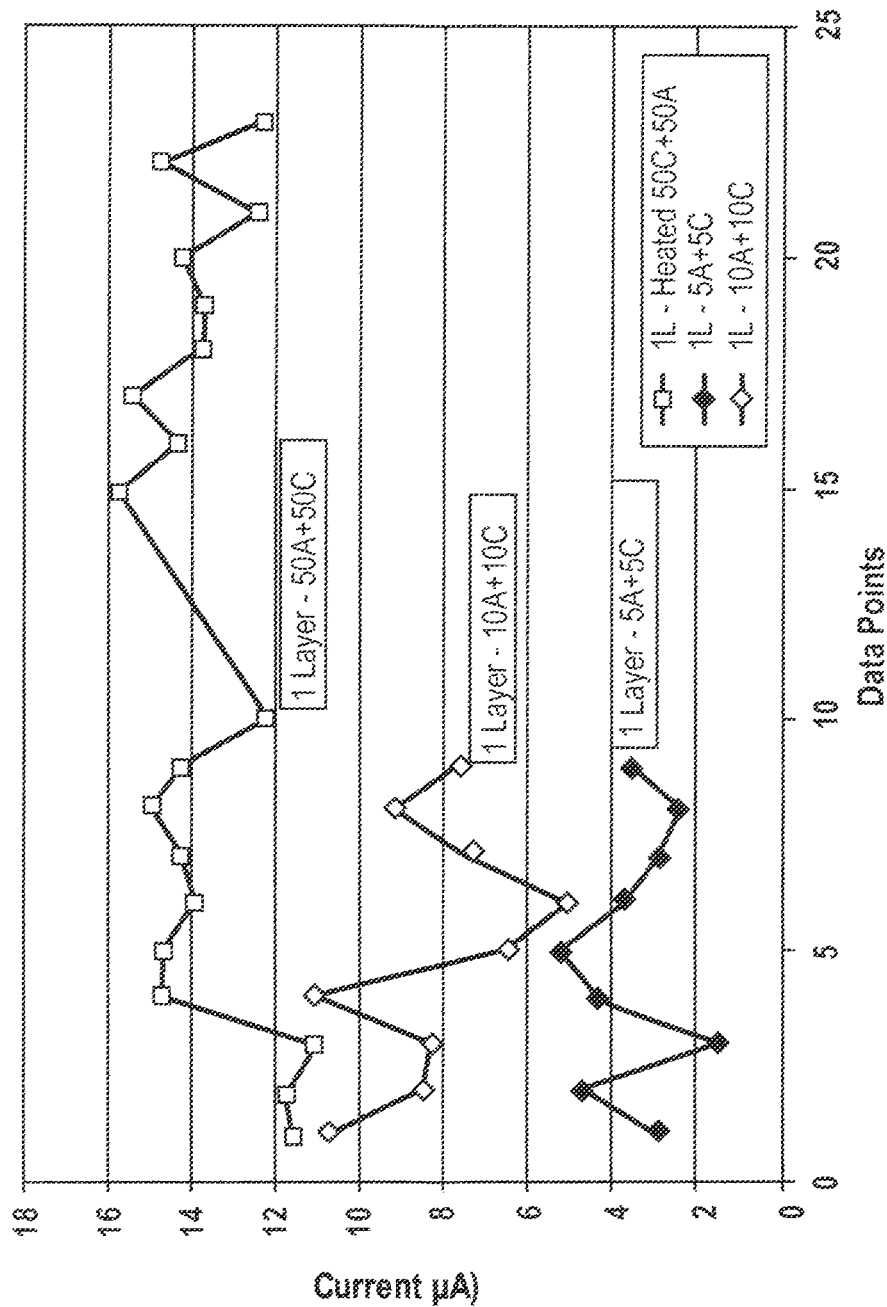
FIG. 16 shows the current reading for 50A+50C, 1OA+1OC, and 5A+5C (all 1 layer) showing effect of number of electrodes.
Figure 17:
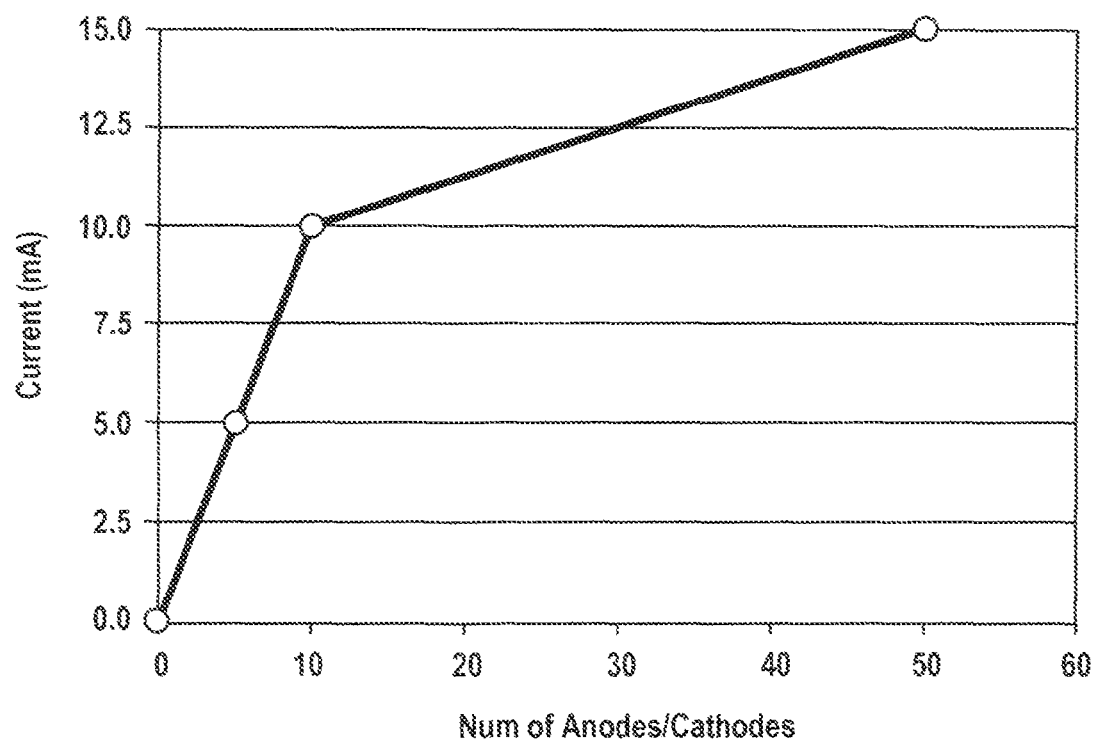
FIG. 17 shows the variation of current with number of electrodes.
Figure 18:
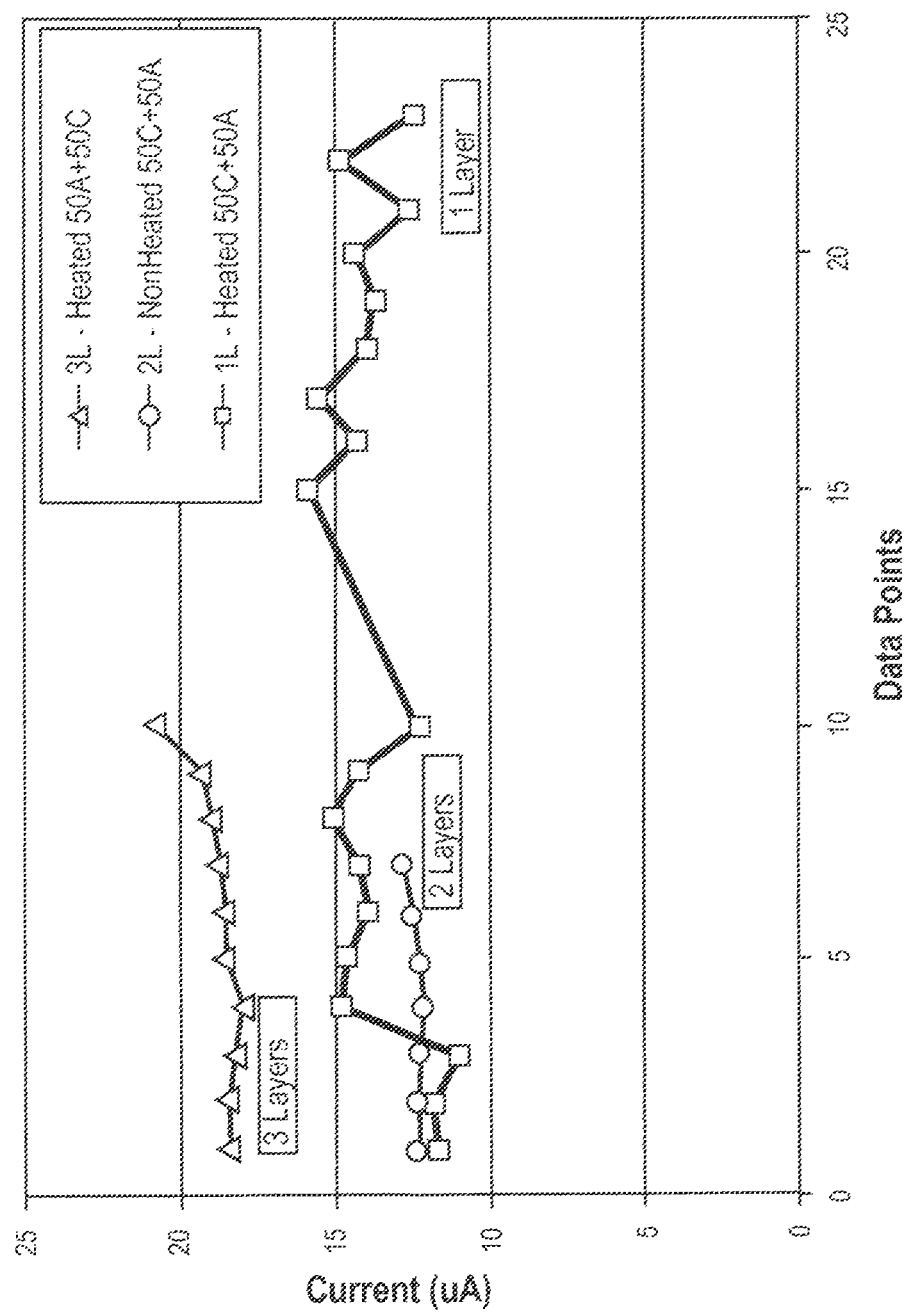
FIG. 18 shows the current reading for 50A+50C showing effect of photoactive material layers.
Figure 19:
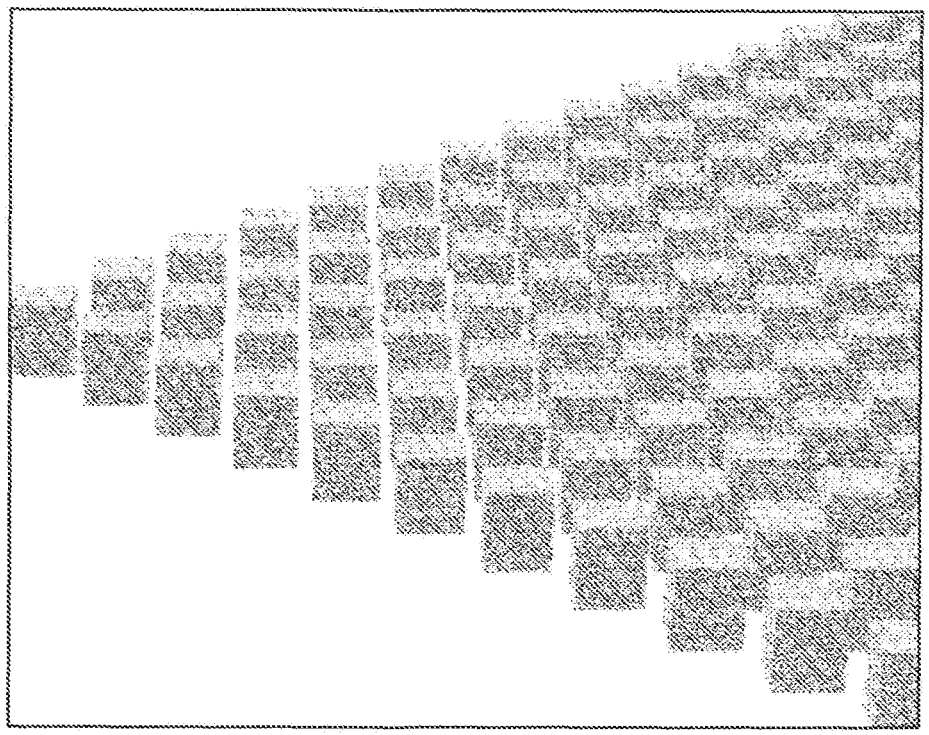
FIG. 19 shows Different configurations for optimizing exposed areas in 3-D architecture of all-polymer solar cell.
Figure 20:
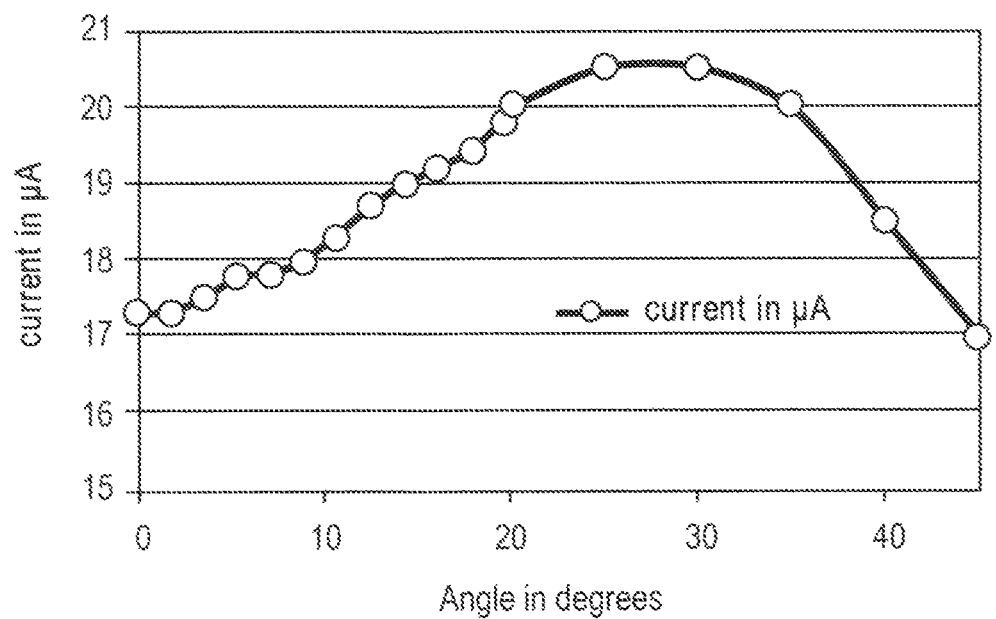
FIG. 20 shows the variation of generated current with the vertical tilt of a chip. The chips are held at 45° in the horizontal plane.
Figure 21:
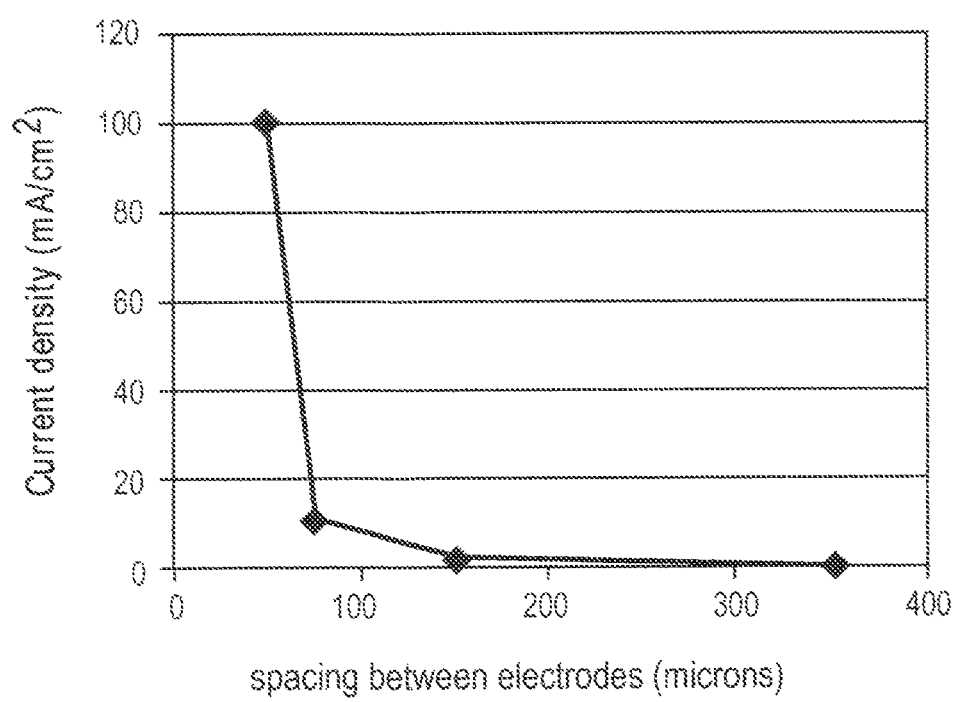
FIG. 21 shows the variation of generated current with spacing of electrodes.
Figure 22:
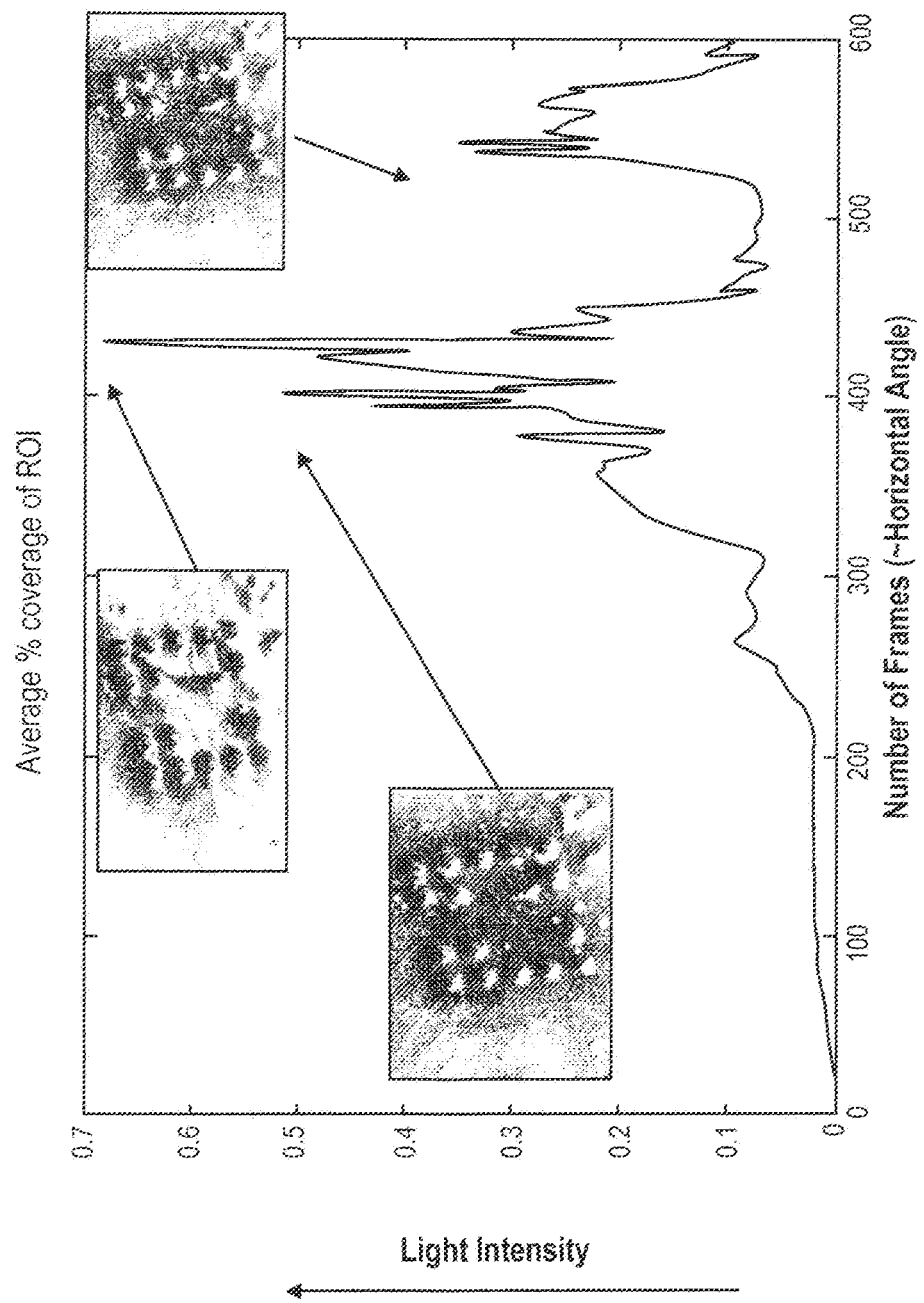
FIG. 22 shows the variation of incident light on an array of 5×5 3-D electrodes as a function of horizontal angle of incidence of light source.

The results are summarized in FIGS. 13-20. FIG. 13 shows current readings for all tested chips. FIG. 14 shows that heat treatment produces more current carrying capacity. It is known that graphite electrodes have better conductivity when heated to moderate degree. The effect of number of electrodes is shown in FIGS. 15 and 16. It can be observed that a fifty cathodes and fifty anodes configuration at 350 micron spacing gives a maximum of 20 micro Amps of current. It can be inferred that a 1 cm×1 cm chip could have a total of 30×30 array at the same spacing resulting in a 450 anode and 450 cathode configuration with current generation of 200 micro Amps/cm2. The effect of spacing is investigated by building much denser arrays.

Next, the effect of electrode spacing and electrode density is investigated (see Table 1). The range of electrode spacing considered varies from 350 μm down to 50 μm. In subsequent generations of chips, tighter spacing going down to micron and sub-micron levels will be considered. The current densities corresponding to these ranges are 20 mA/cm2 to 100 mA/cm2.

TABLE 1

| Chip Size | Array Size | Electrode Spacing | Current (A) | Current Density (A/cm$^2$) |
|---|---|---|---|---|
| 1 cm × 1 cm | 10 × 10 | 350 µm | 20 mA | 20 mA/cm$^2$ |
| | 30 × 30 | 350 µm | 200 mA | 200 mA/cm$^2$ |
| | 50 × 50 | 150 µm | 2 mA | 2 mA/cm$^2$ |
| | 75 × 75 | 75 µm | 10 mA | 10 mA/cm$^2$ |
| | 100 × 100 | 50 µm | 100 mA | 100 mA/cm$^2$ |
| 1 cm × 1 cm | 200 × 200 | 20 µm | Generation II | Generation II |
| | 250 × 250 | 10 µm | Ditto | Ditto |
| | 500 × 500 | 1 µm | Ditto | Ditto |
| | 750 × 750 | 0.5 µm | Ditto | Ditto |
| Polymer Ref [41] | — | — | — | 10 mA/cm$^2$ |

Example 4

Sintering of Nanoscopic Nickel Powder

Nickel powder with 200-500 nm particle size (INCO 210H) was used in all experiments. Three experimental/sample configurations were investigated. These are shown in table 2.

TABLE 2

| Configuration | Current Frequency (Hz) | Tip Speed (mm/s) | Tip Diameter (mm) | Green Compact Dimensions (mm) | Green Density (% of theoretical) |
|---|---|---|---|---|---|
| A | 0.083 (2 s on: 10 s off) | 0.0 (Stationary) | 2.00 | Diameter: 19.2 Thickness: 2.5 | 51 |
| B | 0.083 (2 s on: 10 s off) | 0.0 (Stationary) | 1.02 | Diameter: 14.3 Thickness: 2.7 | 62 |
| C | 60 (AC) | 16.7 (Moving) | 0.021 | Diameter: 14.3 Thickness: 3.0 | 75 |

Green compacts were placed on a conductive holder, and a tungsten (configuration A and B) or a copper (configuration C) tip was used to apply the contacting pressure and current.

For the moving tip configuration (C), the tip was connected to a CNC programmable XYZ stage that traced a square shape with a travel speed of 16.7 mm/sec and an estimated contact force of ~1 mN, and consequently resulted in a sintered square impression. For the stationary tip, direct current (giving a nominal current density of 1,833 A/cm for configuration A and 12,732 A/cm for configuration B) was used with a 2 s on 1 Os off duty cycle, while for the moving tip (configuration C), a continuous AC current (60 Hz) was used with an estimated current density of ~1×107 A/cm2.

Figure 23B:
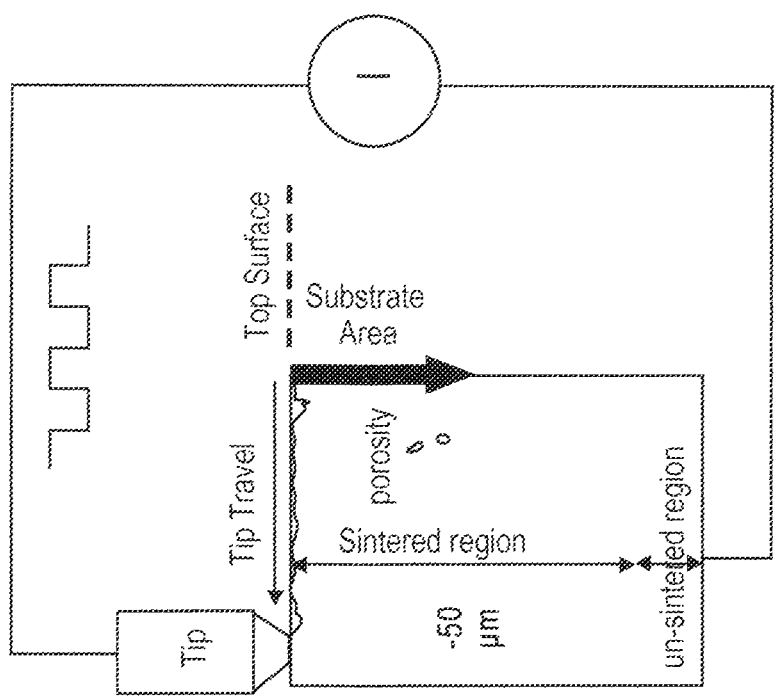
FIG. 23B is an SEM image of part of sintered nickel layer beneath the surface (~50 μm thick) for moving tip configuration (C).
Figure 23A:
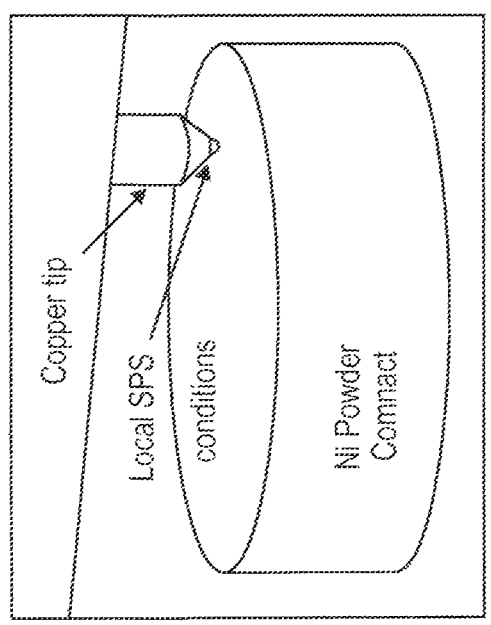
FIG. 23A shows a sintering setup for stationary and moving tip configurations.

For both the stationary tip and the moving tip configurations, the input voltage was 2-5V. The setup is shown in FIG. 23. For microstructural observations, specimens were sectioned and polished to 1 µm finish. Microhardness was conducted using a 500 g load.

For configuration B, the microhardness of the sintered region (at a distance of 250 µm beneath the tip) as seen in FIG. 24B, increases abruptly with number of cycles. The hardness at 0 cycles is that for the green compact, which is higher than that of the green compact in configuration A due to its higher initial green density as seen in table 4. The level of sintering and corresponding hardness is equivalent to that of configuration A, after only 5 cycles. This is largely due to a significantly higher current density which was achieved by a reduction in the tip size compared to configuration A. The increase in current density substantially increases the sintering rate. This is in line with clear observations of increased mass transport under the influence of current. It is anticipated that further reduction in tip size would result in an even higher increase in sintering rate and a reduction in sintering time. This is exemplified in the results of the moving tip configuration C below, which may have significant implications for rapid nano and microfabrication. Another observation is that the sintered depth beneath the tip was also found to increase with number of cycles.

Figure 25A:
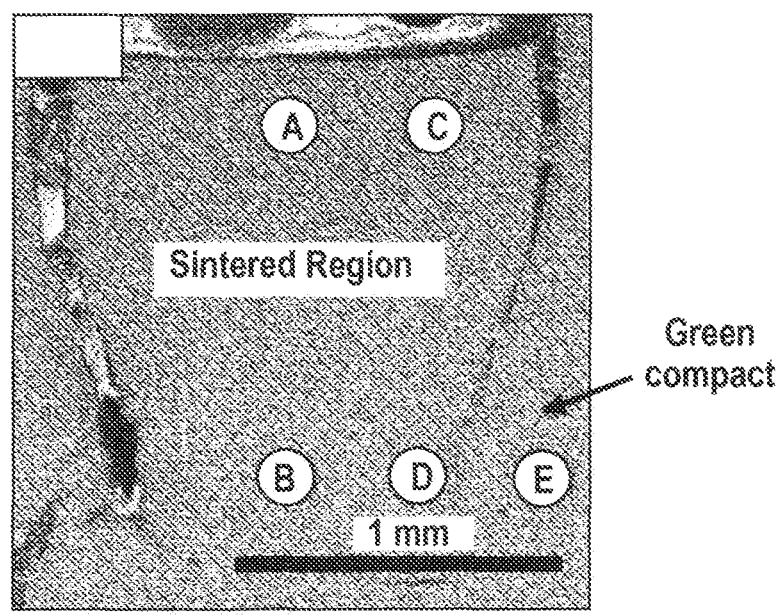
FIG. 25A is an SEM micrograph of cross-section of sintered region beneath tip using configuration B.
Figure 25B:
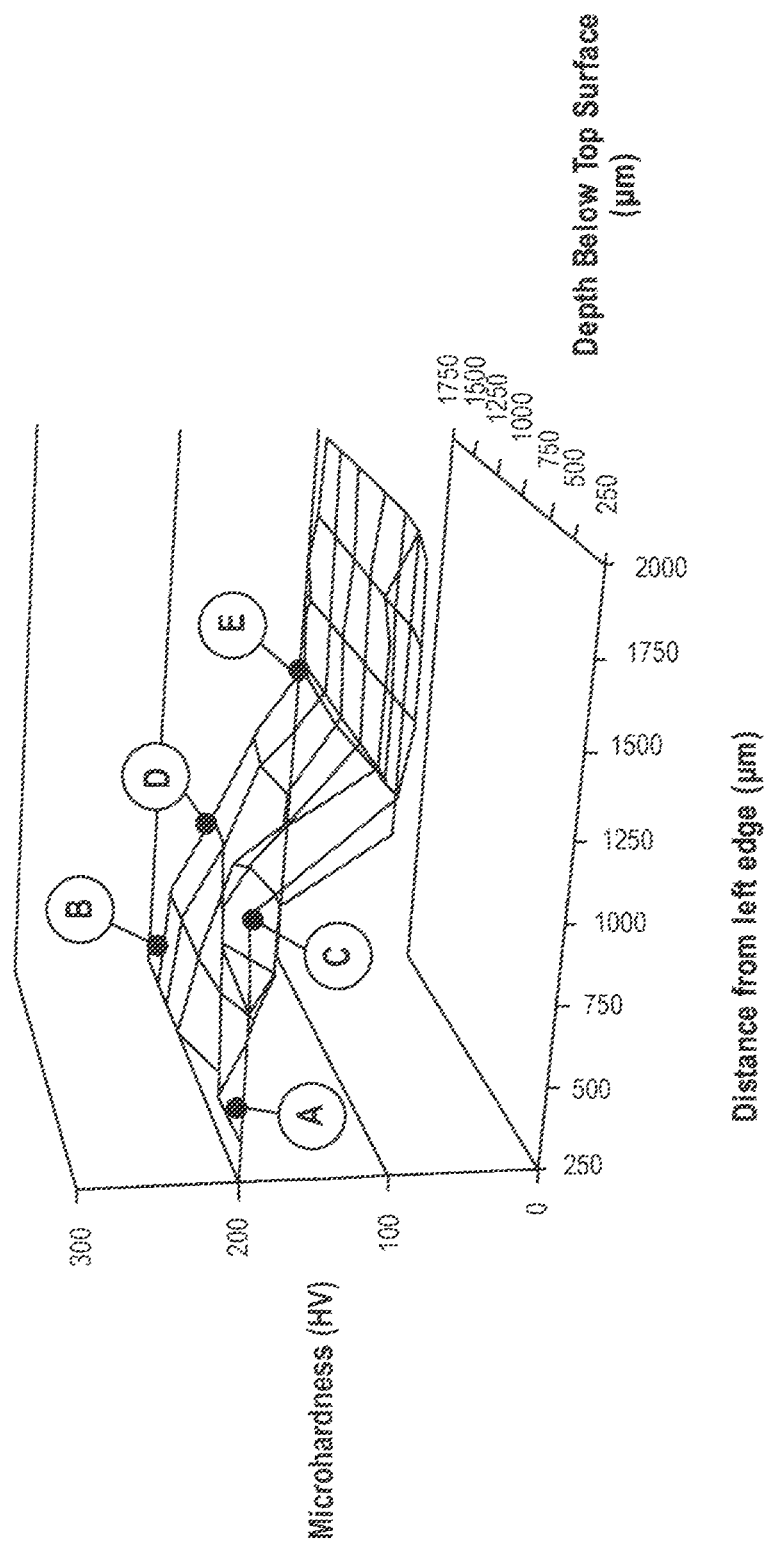
FIG. 25B is a hardness map of the corresponding cross-section.

FIG. 25A is an SEM micrograph of the subsurface cross-section beneath the tip of the locally sintered region (configuration B). It is clear that shrinkage beneath the tip has occurred, while bulk shrinkage appears to have resulted in the formation of cracks. These cracks separate the sintered region from the remaining green compact. It also shows a tunneling effect for the current, where localized sintering is realized. Microhardness mapping confirms the degree of sintering within the locallized region as compared to the surrounding green compact. This can clearly be seen in FIG. 25B, where points A and B possess approximately the same hardness values while point E which is outside the locally sintered region still possesses the hardness value of the green compact. The hardness value of point D is lower than that of point C, indicating a narrowing of the sintered region with depth beneath the surface.

Figure 26A:
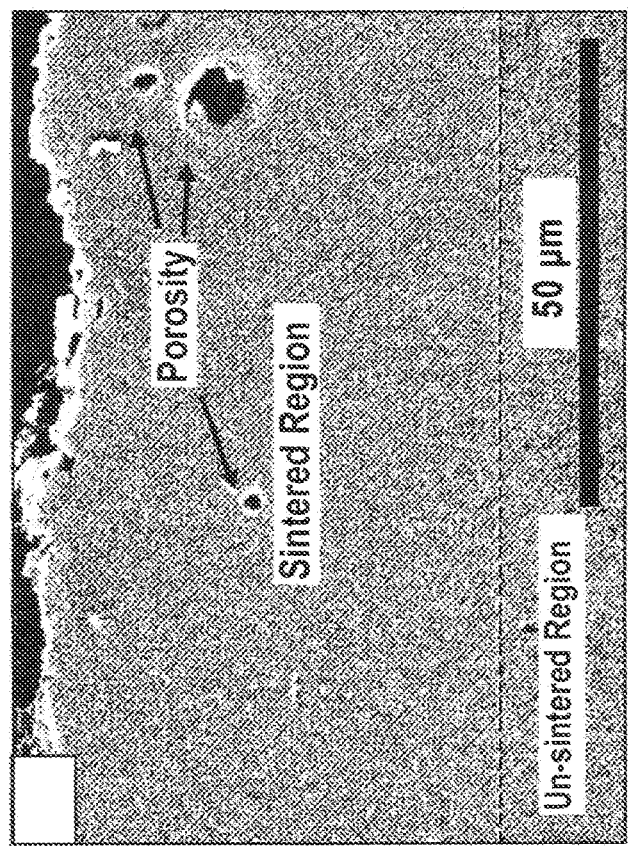
FIG. 26A is an SEM Micrograph of sintered subsurface along the tip path using configuration C.
Figure 26B:
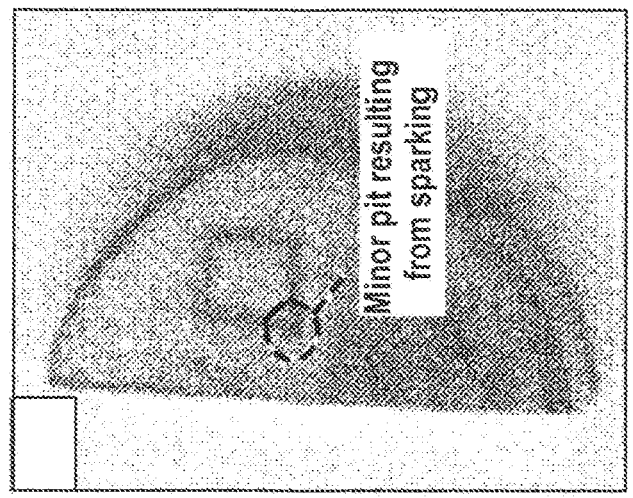
FIG. 26B shows a green compact with locally sintered square impressions using configuration C.

For the moving tip configuration (C), localized compact shrinkage/impression was observed beneath the copper tip following its passage due to sintering (see FIG. 26B). This was not however observed when the tip traced the same shape in the absence of current. Following CATS, the specimens were sectioned along/parallel to the sintered path, in order to observe/characterize the region beneath tip (see FIG. 26A). FIG. 26A shows that a region ~50 µm beneath the tip was sintered compared to the remaining regions in the compact. The localization and rapid sintering effect seen for configuration C is largely due to the excessively high current density (~1×10$^7$ A/cm$^2$) promoting exceedingly rapid sintering rates and the high tip speed (16.7 mm/s) which acts to confine conduction away from the tip thus promoting localization of the sintering to a small region below the tip. Some residual porosity was also observed as seen in FIG. 26A, however at a different level and scale compared to the remainder of the un-sintered compact. It must be mentioned that as shown in FIG. 26B, sparking can occur if the tip is removed prior to de-activating the current, which leads to minor pit formation. Hence, maintaining contact between the tip and the powder surface during sintering appears to be important.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

We claim:

1. A photovoltaic cell comprising:
   an array of microelectrodes on a substrate, said microelectrodes comprised of a conductive or semi-conductive material, each of said microelectrodes shaped as a uniformly spaced apart protrusion, wherein the microelectrodes comprise both anodes and cathodes, wherein the conductive or semi-conductive material is selected from: carbon, a carbon allotrope, or an organic polymer, or combinations thereof;
   wherein each of said uniformly spaced apart protrusion has a diameter of at least 150 μm and a height that is greater than the diameter;
   wherein the uniform spacing between protrusions is from about 0.5 μm to about 350 μm, and wherein the anodes are coated with a conductive polymer; and,
   at least one photoactive material in combination with said microelectrodes, wherein the photoactive material comprises crystalline silicone, cadmium telluride copper-indium selenide, copper indium/gallium diselenide, ruthenium metalorganic dye, P3HT (poly(3-hexylthiophene)), PCBM (phenyl-C61-butyric acid methyl ester), or combinations thereof; and,
   one or more wire traces layered on or within the substrate connecting two or more microelectrodes.

2. The cell of claim 1, wherein the shape of the electrodes varies along the vertical axis and wherein the photovoltaic cell provides energy conversion efficiency of at least 5%, 7%, 10%, 15%, 20%, 25%, 30%, 40% or 50%.

3. The cell of claim 1, wherein at least some of the anodes are coated with PEDOT:PSS.

4. The cell of claim 1, further comprising two clear layers whereby the microelectrodes and the photoactive material are sandwiched between the two clear layers.

5. The cell of claim 4, wherein the electromagnetic radiation passes through at least two of the clear layers and at least a portion of said electromagnetic radiation is converted to energy.

6. The cell of claim 5, wherein the electromagnetic radiation is visible light.

7. The cell of claim 5, wherein a photon from the electromagnetic radiation is absorbed by the photoactive material.

8. The cell of claim 7, wherein the photoactive material comprises a donor polymer and absorption of the photon excites an electron in the donor polymer.

9. The cell of claim 8, wherein an excited electron migrates to the cathode creating a potential difference.

10. The cell of claim 1, wherein the diffusion length for migrating charges is less than 100 nm.

11. The cell of claim 1, wherein at least some of the anodes have a work function of 5 eV or higher.

12. The cell of claim 1, wherein at least some of the cathodes have a work function of 5 eV or higher.

13. The cell of claim 1, wherein at least some of the microelectrodes are cylinder-shaped protrusions, pyramid-shaped protrusions, diamond-shaped protrusions, sphere-shaped protrusions, hemisphere-shaped protrusions, or rectangular prism-shaped protrusions.

14. The cell of claim 1, wherein the microelectrodes are pyramid-shaped protrusions.

15. A solar panel comprising a plurality of photovoltaic cells according to claim 1.

16. The photovoltaic cell of claim 1, wherein the photoactive material comprises P3HT (poly(3-hexylthiophene)), PCBM (phenyl-C61-butyric acid methyl ester), or combinations thereof.

17. The photovoltaic cell of claim 1, further comprising a second photoactive material in combination with the microelectrode; and wherein the absorption spectrum of the first photoactive material and the absorption of the second photoactive material are different.

18. The photovoltaic cell of claim 1, wherein the array of microelectrodes are configured on a single chip as an array selected from the group consisting of: a 5×5 array; a 10×10 array; a 30×30 array; a 50×50 array; a 75×75 array; a 100×100 array; a 200×200 array; a 250×250 array; a 500×500 array; and a 750×750 array.

* * * * *